(12) United States Patent
Yokozeki

(10) Patent No.: US 6,504,217 B1
(45) Date of Patent: Jan. 7, 2003

(54) SEMICONDUCTOR DEVICE AND A METHOD OF MANUFACTURING THE SAME

(75) Inventor: Wataru Yokozeki, Tokyo (JP)

(73) Assignee: United Microelectronics Corporation, Hsin Chu (TW)

( * ) Notice: Subject to any disclaimer, the term of this patent is extended or adjusted under 35 U.S.C. 154(b) by 0 days.

(21) Appl. No.: 09/481,693

(22) Filed: Jan. 12, 2000

Related U.S. Application Data

(63) Continuation of application No. 09/016,731, filed on Jan. 30, 1998, now Pat. No. 6,066,894.

(30) Foreign Application Priority Data

Feb. 7, 1997 (JP) .................................................. 9-40111

(51) Int. Cl.$^7$ ........................ H01L 31/062; H01L 29/40
(52) U.S. Cl. ...................... 257/368; 257/755; 257/756; 257/757; 257/775
(58) Field of Search ................................ 257/368, 755, 257/756, 757, 774, 763, 764, 754, 775; 438/647, 655, 657, 656

(56) References Cited

U.S. PATENT DOCUMENTS

| | | | | |
|---|---|---|---|---|
| 5,068,710 A | * | 11/1991 | Owada et al. | 257/754 |
| 5,371,024 A | * | 12/1994 | Hieda et al. | 257/291 |
| 5,436,178 A | * | 7/1995 | Kimura | 257/327 |
| 5,583,361 A | * | 12/1996 | Morishita | 257/345 |
| 5,623,165 A | * | 4/1997 | Yamauchi | 257/756 |

FOREIGN PATENT DOCUMENTS

| | | |
|---|---|---|
| JP | 8-78671 | 3/1996 |
| JP | 2554055 | 11/1996 |
| JP | 9-74188 | * 3/1997 |

OTHER PUBLICATIONS

Wong et al., Elevated Source/Drain Mosfet, Hewlett–Packard Laboratories, Palo Alto, CA, CH2099–0/84/0000–0634—1984 IEDM, pp–634–637.

Pfiester et al., Reverse Elevated Source/Drain (RESD) MOSFET for Deep Submicron CMOS, Advanced Products Research and Development Laboratory, Motorola Inc., Austin, TX, 0–7803–0817–4.92, 1992 IEEE, IEDM, pp. 885–888.

* cited by examiner

*Primary Examiner*—Jasmine J B Clark
(74) *Attorney, Agent, or Firm*—Connolly Bove Lodge & Hutz, LLP; Larry J. Hume

(57) ABSTRACT

A low-concentration impurity region and a high-concentration impurity region are formed respectively near the lower surface and the upper surface of an undoped polysilicon film by a first and second ion-implantations. A refractory metal film of tungsten or the like is formed on the polysilicon film. The impurities are thermally diffused to form shallow-junctions of source/drain having low-concentration impurities. Lead-out electrodes having a high-impurity concentration can be formed without impeding formation of the source and drain. The refractory metal film is converted into a silicide with the resistance at the interface between the polysilicon film and the silicide kept lowered.

15 Claims, 28 Drawing Sheets

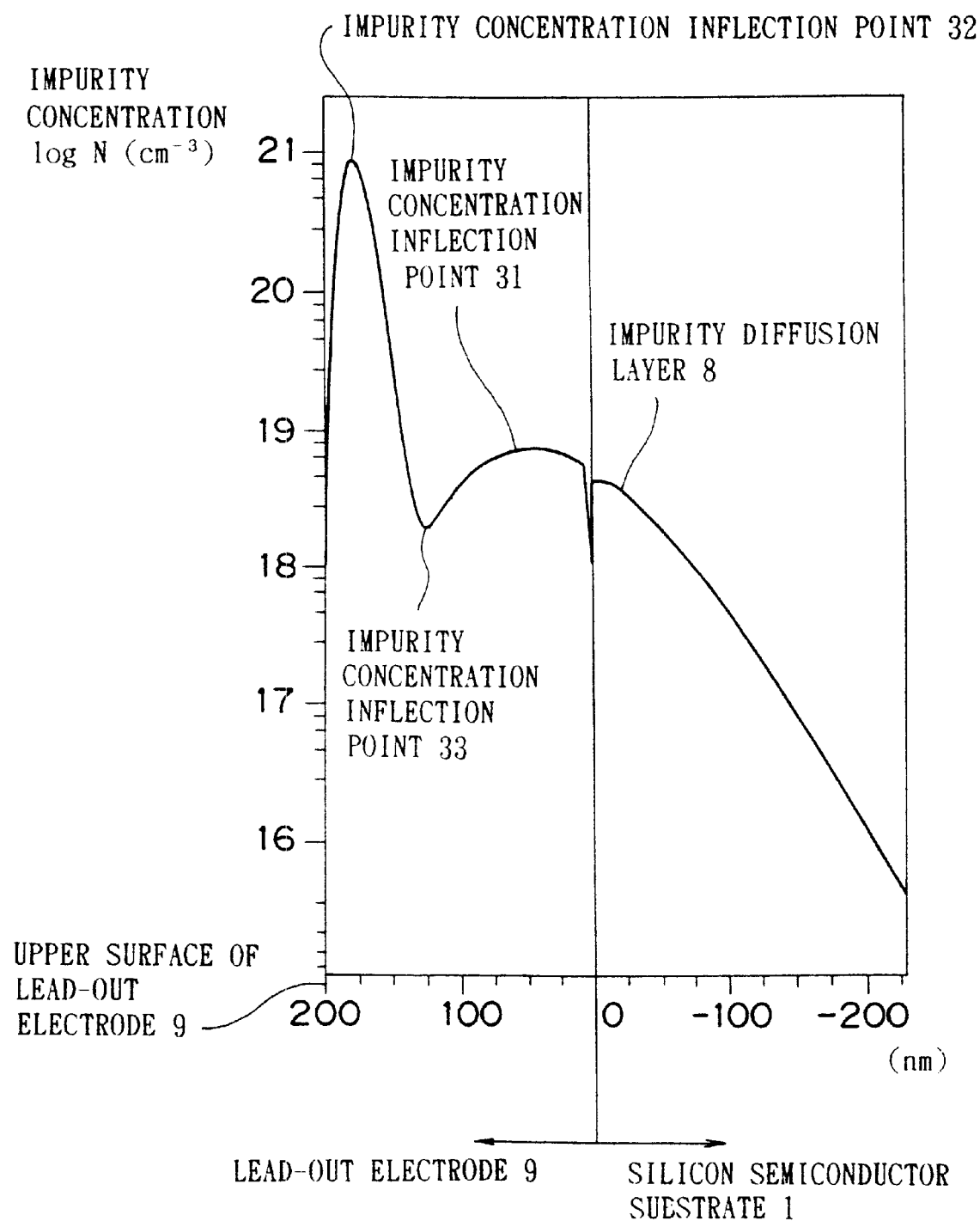

SEMICONDUCTOR DEVICE AND A METHOD OF MANUFACTURING THE SAME

This application is a continuation of U.S. patent application Ser. No. 09/016,731, filed Jan. 30, 1998. Now U.S. Pat. No. 6,066,894.

BACKGROUND OF THE INVENTION

1. Field of the Invention

The present invention relates to, e.g., a MOS semiconductor device and a method of manufacturing the same and, more particularly, to a MOS semiconductor device having an improved source/drain region and to a method of manufacturing the same.

2. Background of the Invention

Recently, micropatterning and integration technologies for semiconductor devices are advancing. However, micropatterning of semiconductor devices is not based on scaling of a constant electric field, and the electric field in a semiconductor device tends to increase as the device is more finely micropatterned. Especially, in a MOS transistor, degradation in characteristics due to hot carriers is a serious problem.

As a preferable method of suppressing generation of hot carriers, a method of forming a source/drain having a so-called LDD structure is proposed, in which the first diffusion layer (LDD region) having a shallow junction and the second diffusion layer having a junction deeper than the first diffusion layer are made to partially overlap to form an impurity diffusion layer. According to the LDD structure, the concentration gradient at the drain end becomes gradual because of the relatively lightly doped LDD region, resulting in relaxation of field concentration. This decreases the substrate current, thereby suppressing generation of hot carriers.

The LDD region has a concentration for minimizing the substrate current at the drain end. This optimum concentration tends to gradually become high as the semiconductor device is more finely micropatterned. However, an increase in the concentration of the LDD region prompts the short channel effect, resulting in a decrease in threshold voltage or an increase in leakage current (punch through).

To suppress the short channel effect, the junction of the source/drain region may be made shallow. More specifically, the acceleration energy for ion-implanting impurities into the semiconductor substrate may be lowered, or annealing in device formation may be performed at a low temperature or for a short time. The shallow junction of the source/drain region also contributes to suppressing generation of hot carriers.

However, when the junction of the source/drain region is made shallow, the sheet resistance in this region increases, and the parasitic resistance also increases. The increase in parasitic resistance causes not only degradation in driving capability of the semiconductor device but also a decrease in switching speed of the logic circuit or a decrease in operation margin of the semiconductor storage device (memory), resulting in degradation in characteristics.

To suppress the increase in parasitic resistance due to the shallow junction, a so-called raised source/drain structure is proposed (S. S. Wong et al., IEDM Technology Digest p. 634, 1984), in which the source/drain region is formed by raising it from the semiconductor substrate surface. A method using both the raised source/drain structure and the LDD structure is also proposed (J. R. Pfiester et al., IEDM Technology Digest p. 885, 1992). Even in these methods, however, if annealing in device formation is the same as in the conventional method, the degree of thermal diffusion does not change, and the junction depth from the semiconductor substrate surface does not change either, so the above problem cannot be solved.

Japanese Patent Laid-Open No. 8-78671 discloses a method of implanting impurity ions through an ion implantation pad made of an insulating film or a conductive film to enable formation of a shallow junction by conventional annealing. In this method, dispersion due to ion scattering is increased so that the impurity distribution on the semiconductor substrate surface has a low peak and a large dispersion. However, in this method, the use of an insulating film as the ion implantation pad only enables forming of a shallow junction and it and cannot suppress the increase in parasitic resistance. When a conductive film is used as the ion implantation pad, the impurity concentration in the conductive film is lowered, so the sheet resistance of the conductive film cannot be sufficiently lowered. More specifically, when impurities are ion-implanted into the conductive film at a dose for sufficiently decreasing the sheet resistance, the impurities are diffused by subsequent annealing, so the shallow junction can hardly be formed.

Japanese Patent No. 2554055 discloses a method of implanting ions for forming a low-resistance polysilicon film. In this method, ion implantation is performed so that the impurity concentration is maximized immediately below the surface of the polysilicon film, and the polysilicon film does not become amorphous due to the impurities on the lowermost surface of the polysilicon film.

In fact, with ion implantation performed only once, the resistance of the polysilicon film can hardly be sufficiently lowered. Although this method contributes to reducing the contact resistance to the source/drain region, the effect for making the source/drain junction shallow is small.

SUMMARY OF THE INVENTION

It is an object of the present invention to provide a semiconductor device in which the junction depth of an impurity diffusion layer is made shallow to suppress generation of hot carriers or the short channel effect, and the impurity diffusion layer has a low resistance. The invention also relates to a method of manufacturing a device of the type.

It is another object of the present invention to form a low-resistance lead-out electrode connected to an impurity diffusion layer to suppress an increase in electrical resistance at the interface between the lead-out electrode and the impurity diffusion layer and to also suppress an increase in electrical resistance at the interface between the lead-out electrode and a wiring layer formed on the lead-out electrode.

According to an aspect of the present invention, there is provided a semiconductor device comprising an impurity diffusion layer formed in a semiconductor substrate, and a wiring film connected to the impurity diffusion layer, wherein the wiring film contains impurities, a diffusion profile of the impurities in an entire region of the wiring film in the direction of thickness has at least two impurity concentration inflection points above an interface between the wiring film and the impurity diffusion layer. The impurity concentration inflection points are present in about a lower ⅓ range of a thickness of the wiring film and about an upper ⅓ range of the thickness of the wiring film.

According to another aspect of the present invention, there is provided a semiconductor device comprising a first conductive film buried in an insulating film in an element formation region demarcated on a semiconductor substrate, a pair of impurity diffusion layers formed in a surface region of the semiconductor substrate on both sides of the first conductive film, and second conductive films seperated from each other to be connected respectively to each of the impurity diffusion layers in the semiconductor substrate on both sides of the first conductive film, and containing impurities, wherein a diffusion profile of the impurities in an entire region of the second conductive film in the direction of thickness has at least two impurity concentration inflection points.

According to still another aspect of the present invention, there is provided a semiconductor device comprising an impurity diffusion layer formed in a semiconductor substrate, and a wiring film connected to the impurity diffusion layer, wherein the wiring film contains impurities, a diffusion profile of the impurities in an entire region of the wiring film in the direction of thickness has at least one impurity concentration inflection point above an interface between the wiring film and the impurity diffusion layer, and the impurity concentration inflection point is present in about a lower ⅓ range of a thickness of the wiring film.

According to still another aspect of the present invention, there is provided a semiconductor device comprising an impurity diffusion layer formed in a semiconductor substrate, and a wiring film connected to the impurity diffusion layer, wherein the wiring film contains impurities, and a diffusion profile of the impurities in an entire region of the wiring film in the direction of thickness has at least two impurity concentration inflection points.

According to still another aspect of the present invention, there is provided a semiconductor device comprising an impurity diffusion layer formed in a semiconductor substrate, a wiring film connected to the impurity diffusion layer, and a silicide film formed on the wiring film, wherein the wiring film contains impurities, a diffusion profile of the impurities in an entire region of the wiring film in the direction of thickness has at least one impurity concentration inflection point above an interface between the wiring film and the impurity diffusion layer, and the impurity concentration inflection point is present in about an upper ⅓ range of a thickness of the wiring film.

According to still another aspect of the present invention, there is provided a semiconductor device comprising an impurity diffusion layer formed in a semiconductor substrate, and a wiring film connected to the impurity diffusion layer, wherein the wiring film contains impurities, a diffusion profile of the impurities in an entire region of the wiring film in the direction of thickness has n (n is An integer, $n \geq 2$) different impurity concentration inflection points, and the impurity concentration inflection points are present in different ranges each corresponding to about 1/n of a thickness of the wiring film.

According to still another aspect of the present invention, there is provided a semiconductor device comprising a thin film as a prospective conductive film, an impurity concentration peak is formed near at least one of an upper end face and lower end face of the thin film, and a conductive film connected to the end face close to a region where the impurity concentration peak is formed.

According to still another aspect of the present invention, there is provided a method of manufacturing a semiconductor device, comprising 1) a first step of sequentially forming a first insulating film, a first conductive film, and a second insulating film in an element formation region demarcated on a semiconductor substrate and patterning the first insulating film, the first conductive film, and the second insulating film; 2) a second step of forming a third insulating film on a side surface of at least the first conductive film; 3) a third step of forming a silicon film on the semiconductor substrate to cover the second and third insulating films; 4) a fourth step of doping first impurities having a conductivity type opposite to that of the semiconductor substrate into the silicon film so that a concentration peak is formed near a lower surface of the silicon film; 5) a fifth step of doping second impurities having a conductivity type opposite to that of the semiconductor substrate into the silicon film so that a concentration peak is formed near an upper surface of the silicon film, 6) a sixth step of dividing the silicon film at least on the second insulating film, and 7) a seventh step of annealing the semiconductor substrate to diffuse the first impurities into the semiconductor substrate, thereby forming a pair of impurity diffusion layers each having a shallow junction, and diffusing the first and second impurities in the silicon film, thereby forming a second conductive film.

According to still another aspect of the present invention, there is provided a method of manufacturing a semiconductor device including a transistor having a gate and a pair of impurity diffusion layer 3 in a semiconductor substrate, comprising a first step of covering the gate with an insulating film, a second step of forming a silicon film constituting part of a lead-out electrode connected to the impurity diffusion layer to cover the semiconductor substrate over an upper portion of the insulating film, a third step of polishing the silicon film until the upper portion of the insulating film is exposed, a fourth step of doping first impurities having a conductivity type opposite to that of the semiconductor substrate into the silicon film such that a concentration peak is formed near a lower surface of the silicon film, a fifth step of doping second impurities having a conductivity type opposite to that of the semiconductor substrate into the silicon film such that a concentration peak is formed near an upper surface of the silicon film, and a sixth step of annealing the semiconductor substrate to diffuse the first impurities into the semiconductor substrate, thereby forming the pair of impurity diffusion layers each having a shallow junction, and diffusing the first and second impurities in the silicon film, thereby forming the lead-out electrode.

According to still another aspect of the present invention, there is provided a method of manufacturing a semiconductor device, comprising a first step of forming a thin film as a prospective conductive film, a second step of doping impurities into a portion near an upper surface of the thin film, a third step of forming a refractory metal film on the thin film, and a fourth step of annealing the thin film and the refractory metal film to cause the thin film and the refractory metal film to react each other.

According to still another aspect of the present invention, there is provided a method of manufacturing a semiconductor device, comprising a first step of sequentially forming a first insulating film, a first conductive film, and a second insulating film in an element formation region demarcated on a semiconductor substrate and patterning the first insulating film, the first conductive film, and the second insulating film, the second step of forming a third insulating film on a side surface of at least the first conductive film, a third step of forming a silicon film on the semiconductor substrate to cover the second and third insulating films, a fourth step of doping first impurities having a conductivity type opposite to that of the semiconductor substrate into the silicon film such that a concentration peak is formed near a lower surface of the silicon film, a fifth step of doping second impurities having a conductivity type opposite to that of the semiconductor substrate into the silicon film such that a concentration peak is formed near an upper surface of the silicon film, a sixth step of dividing the silicon film at least on the second insulating film, a seventh step of forming a refractory metal film to cover at least part of the silicon film, and a eighth step of annealing the semiconductor substrate to diffuse the first impurities into the semiconductor substrate, thereby forming a pair of impurity diffusion layers each having a shallow junction, diffusing the first and second impurities in the silicon film, thereby forming a second conductive film, and converting the refractory metal film into a silicide.

In the present invention, the silicon film is formed on the semiconductor substrate on both sides of the first conductive film, and impurities are doped into the silicon film twice to form the second conductive film. For the first time, impurities are doped at a relatively low concentration such that the concentration peak is formed near the lower surface of the silicon film. For the second time, impurities are doped at a relatively high concentration such that the concentration peak is formed near the upper surface of the silicon film. The relatively low-concentration impurity distribution formed by the first impurity doping is diffused into the semiconductor substrate by subsequent annealing to form, e.g., a source/drain region as an impurity diffusion layer having a lightly doped shallow junction. On the other hand, the relatively high-concentration impurity distribution formed by the second impurity doping is diffused into the silicon film by subsequent annealing to form the second conductive film diffused by the high-concentration impurities. When the second impurity doping is performed such that the impurities are distributed in a sufficiently shallow portion near the surface of the silicon film, formation of the impurity diffusion layer having a lightly doped shallow junction is not impeded by subsequent annealing. Therefore, the impurity diffusion layer having a shallow junction can be formed to suppress generation of hot carriers or the short channel effect. In addition, the resistance of the impurity diffusion layer can be lowered.

In the present invention, the high-concentration impurity diffusion layer is formed near the upper surface of the silicon film by ion implantation. After the refractory metal film is formed on the silicon film, annealing is performed to convert the refractory metal film into a silicide. Even when the impurities in the silicon film are diffused to the refractory metal film side by annealing, the impurity concentration near the interface between the silicon film and the refractory metal film can be kept high. Therefore, the refractory metal film as a silicide film can be formed on the silicon film while keeping the resistance of the silicon film low.

According to the present invention, the junction depth of the impurity diffusion layer in the semiconductor device can be made shallow to suppress generation of hot carriers or the short channel effect. In addition, the resistance of the impurity diffusion layer can be lowered.

BRIEF DESCRIPTION OF THE DRAWINGS

FIG. 2 is a graph showing the relationship between the impurity concentration and the depth from the surface in a lead-out electrode and a silicon semiconductor substrate of the MOS transistor according to the first embodiment;

DETAILED DESCRIPTION OF THE PREFERRED EMBODIMENTS

First Embodiment

The first embodiment of the present invention will be described first. In the first embodiment, a MOS transistor will be described. FIGS. 1A to 1G are schematic sectional views showing steps in manufacturing the MOS transistor according to the first embodiment.

Figure 1A:
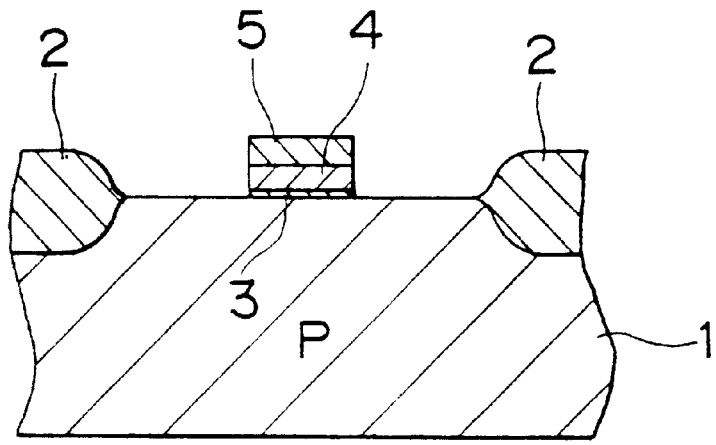
FIGS. 1A to 1G are schematic sectional views showing steps in manufacturing a MOS transistor according to the first embodiment.

As shown in FIG. 1A, a thermal oxide film is formed on a p-type silicon semiconductor substrate 1, and a silicon nitride film is formed on the thermal oxide film. A portion where the silicon semiconductor substrate 1 is not covered with the silicon nitride film is annealed in a high-temperature water vapor atmosphere to form a field oxide film 2, thereby demarcating an element formation region on the silicon semiconductor substrate 1. Instead of forming the field oxide film 2, a field shield element isolation structure burying a conductive film in an oxide film may be formed by a so-called field shield element isolation method.

After the thermal oxide film and the silicon nitride film are removed, annealing is performed in a high-temperature oxygen atmosphere to form a gate oxide film 3 on the silicon semiconductor substrate 1 in the element formation region.

An $n^+$-type polysilicon film and a silicon oxide film are sequentially deposited on the gate oxide film 3 by, e.g., CVD. The silicon oxide film, the polysilicon film, and the gate oxide film 3 are patterned by photolithography and dry etching to form the band-shaped gate oxide film 3, a gate electrode 4, and a cap oxide film 5.

Figure 1B:
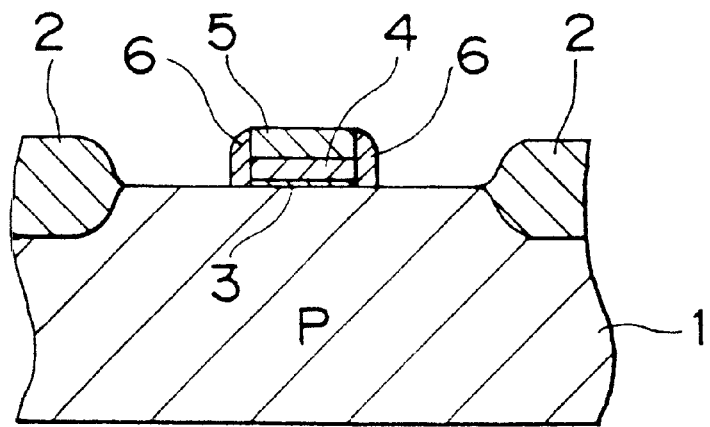

A silicon oxide film is deposited on the entire surface of the silicon semiconductor substrate 1 by, e.g., CVD. The entire surface of the silicon oxide film is subjected to anisotropic dry etching to leave the silicon oxide film on the side surfaces of the gate oxide film 3, the gate electrode 4, and the cap oxide film 5, thereby forming a side wall protective film 6, as shown in FIG. 1B.

Figure 1C:
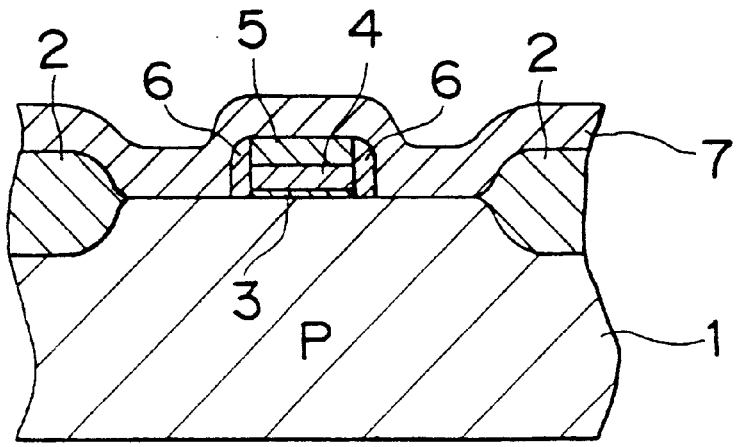

As shown in FIG. 1C, an undoped polysilicon film 7 having a thickness of about 200 nm is formed on the entire surface of the silicon semiconductor substrate 1, including the upper surface of the field oxide film 2, by, e.g., CVD.

Figure 1D:
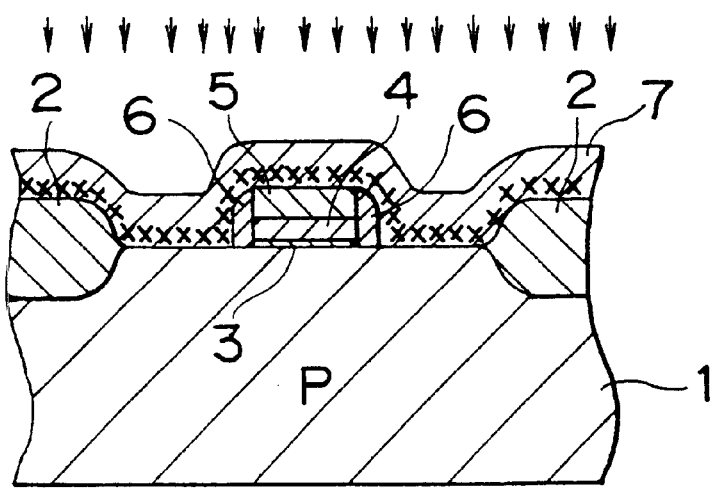

As shown in FIG. 1D, as the first ion implantation, n-type impurities, e.g., phosphorus (P), are ion-implanted into the polysilicon film 7. This ion implantation is performed while setting the acceleration energy at about 160 (keV) and the dose at a low concentration of about $1\times10^{12}$ to $1\times10^{14}$ (1/cm$^2$), about $5\times10^{13}$ (1/cm$^2$) in this case, such that the concentration peak is formed near the lower surface of the polysilicon film 7, and the impurities are present in about a lower ⅓ range of the thickness of the polysilicon film 7. The interface between the polysilicon film 7 and the silicon semiconductor substrate 1 is in a nondamaged state, i.e., in a nonamorphous state.

Figure 1E:
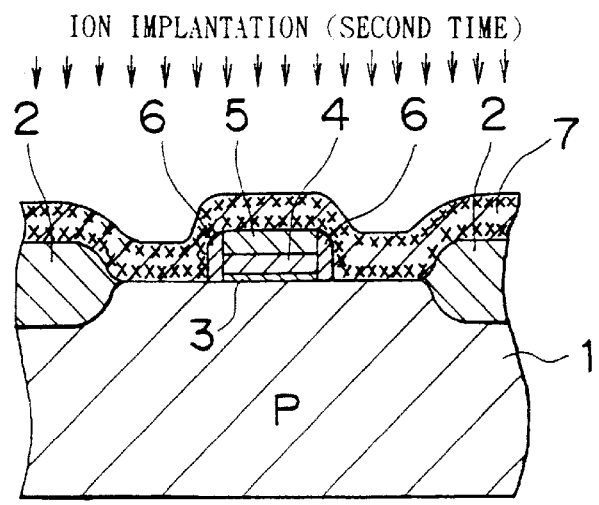

As shown in FIG. 1E, as the second ion implantation, n-type impurities, e.g., phosphorus (P), are ion-implanted into the polysilicon film 7. This ion implantation is performed while setting the acceleration energy at about 30 (kev) and the dose at a high concentration of about $1\times10^{15}$ to $1\times10^{16}$ (1/cm²), about $2\times10^{15}$ (1/cm²) in this case, such that the concentration peak is formed near the upper surface of the polysilicon film 7, and the impurities are present in about an upper ⅓ range of the thickness of the polysilicon film 7.

Figure 1F:
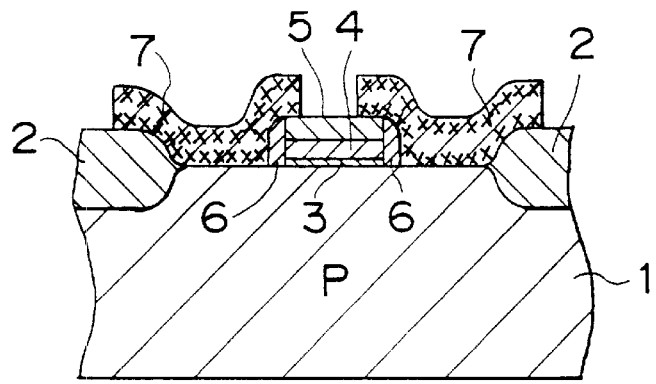

As shown in FIG. 1F, the polysilicon film 7 is patterned by photolithography and dry etching and separated on the cap oxide film 5 and the field oxide film 2.

Figure 1G:
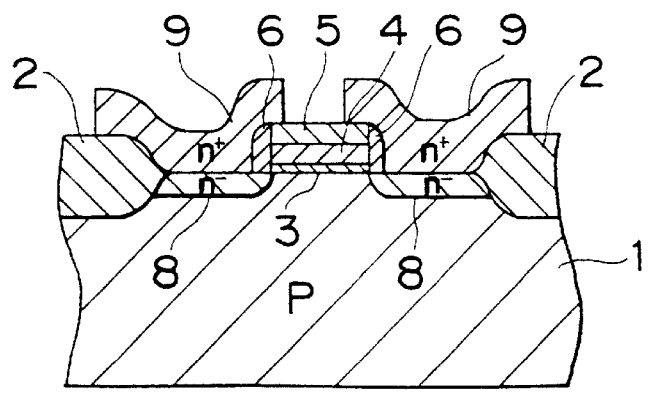

As shown in FIG. 1G, the silicon semiconductor substrate 1 is annealed at 600° C. or more, about 850° C. in this case, for 30 min. At this time, the relatively low-concentration impurities distributed by the first ion implantation are diffused into the silicon semiconductor substrate 1 to form a pair of impurity diffusion layers 8 serving as source and drain regions each having a lightly doped shallow junction.

As described above, when the dose for the first ion implantation is set within the range of about $1\times10^{12}$ to $1\times10^{14}$ (1/cm²), and phosphorus is ion-implanted such that the impurities are present in about the lower ⅓ range of the thickness of the polysilicon film 7, the impurity diffusion layers 8 can be formed to have a lightly doped shallow junction, as desired. In addition, ion implantation of phosphorus having a small diffusion coefficient is more effective to form the shallow junction. When arsenic (As) is to be ion-implanted in the first ion implantation, it is appropriate to set the acceleration energy at about 300 (kev) and the dose at about $1\times10^{14}$ (1/cm²).

On the other hand, the relatively high-concentration impurities distributed by the second ion implantation are diffused in the polysilicon film 7 by the above-described annealing. The high-concentration impurities are diffused to form lead-out electrodes 9. When the second ion implantation is performed such that the impurities are present in a sufficiently shallow portion near the upper surface of the polysilicon film 7, formation of the impurity diffusion layers 8 having a lightly doped shallow junction is not impeded by subsequent annealing.

As described above, when the dose for the second ion implantation is set within the range of about $1\times10^{15}$ to $1\times10^{16}$ (1/cm²), and phosphorus is ion-implanted such that the impurities are present in about the upper ⅓ range of the thickness of the polysilicon film 7, formation of the impurity diffusion layers 8 is not impeded and the impurity concentration of the lead-out electrode 9 can be kept high. When arsenic (As) having a large diffusion coefficient is ion-implanted as impurities, the concentration of the lead-out electrode 9 can be raised within a wider area. When arsenic (As) is to be ion-implanted in the second ion implantation, it is appropriate to set the acceleration energy at about 30 (keV), and the dose at about $2\times10^{15}$ (1/cm²).

Since the impurity diffusion layers 8 each having a shallow junction are formed, generation of hot carriers and the short channel effect are suppressed. In addition, the resistance of each impurity diffusion layer 8 can be lowered.

FIG. 2 is a graph showing the relationship between the impurity concentration and the depth from the surface in the lead-out-electrode 9 and the silicon semiconductor substrate 1 after annealing. After the first ion implantation, the impurity diffusion profile of the lead-out electrode 9 has an impurity concentration inflection point 3i where the impurity concentration exhibits a maximal value of about $1\times10^{19}$ (1/cm³) within about the ⅓ range of the thickness of the lead-out electrode 9 from the interface between the lead-out electrode 9 and the silicon semiconductor substrate 1.

The impurities ion-implanted by the first ion implantation are diffused into the silicon semiconductor substrate 1 by annealing, so that the impurity diffusion layers 8 each having a lightly doped shallow junction are formed.

After the second ion implantation, the impurity diffusion profile of the lead-out electrode 9 has an impurity concentration inflection point 32 where the impurity concentration exhibits a maximal value of about $1\times10^{21}$ (1/cm³) within about the ⅓ range of the thickness of the lead-out electrode 9 from the upper surface of the lead-out electrode 9.

An impurity concentration inflection point 33 where the impurity concentration exhibits a minimal value is formed between the impurity concentration inflection points 31 and 32. Therefore, the impurities ion-implanted by the second ion implantation do not adversely affect diffusion of the impurities of the first ion implantation into the silicon semiconductor substrate 1.

The impurities are diffused throughout the lead-out electrode 9 by the ion implantation twice, so that the resistance of the lead-out electrode 9 can be lowered. Thereafter, an insulating interlayer is formed on the entire surface of the silicon semiconductor substrate 1. The insulating interlayer is reflowed to planarize the structure. Thereafter, a contact hole is formed to partially expose the surface of the lead-out electrode 9. Wiring layers are formed to fill the contact holes and to be connected to the impurity diffusion layers 8 through the lead-out electrode 9. Postprocessing is performed, thus completing the MOS transistor.

As described above, in the first embodiment, impurities are ion-implanted at a low concentration by the first ion implantation such that the concentration peak is formed near the lower surface of the polysilicon film 7, and the impurities are present in about the lower ⅓ range of the thickness of the polysilicon film 7. Thereafter, impurities are ion-implanted at a high concentration by the second ion implantation such that the concentration peak is formed near the upper surface of the polysilicon film 7, and the impurities are present in about the upper ⅓ range of the thickness of the polysilicon film 7.

Annealing is performed to diffuse the low-concentration impurities of the first ion implantation into the silicon semiconductor substrate 1. With this process, the pair of impurity diffusion layers 8 serving as source and drain regions each having a lightly doped shallow junction can be formed. Simultaneously, the high-concentration impurities of the second ion implantation are diffused in the polysilicon film 7 by the above-described annealing. With this process, the lead-out electrode 9 can be formed by diffusing the high-concentration impurities.

Therefore, the impurity diffusion layers 8 each having a shallow junction are formed to suppress generation of hot carriers and the short channel effect. In addition, the resistance of the lead-out electrode 9 can be lowered.

Second Embodiment

The second embodiment of the present invention will be described next. In the second embodiment, a method of manufacturing a MOS transistor will be described, as in the first embodiment. The second embodiment is different from the first embodiment in the structure of source and drain regions. FIGS. 3A to 3H are schematic sectional views showing steps in manufacturing the MOS transistor according to the second embodiment. The same reference numerals as in the MOS transistor of the first embodiment denote the same constituent elements in the second embodiment, and a detailed description thereof will be omitted.

Figure 3A:
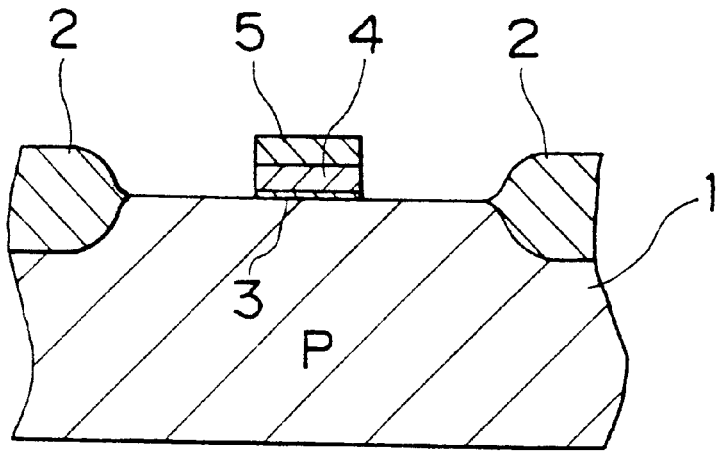
FIGS. 3A to 3H are schematic sectional views showing steps in manufacturing a MOS transistor according to the second embodiment.

In the second embodiment, as shown in FIG. 3A, a field oxide film 2 is formed, and thereafter, a band-shaped gate oxide film 3, a gate electrode 4, and a cap oxide film 5 are patterned, as in the first embodiment.

Figure 3B:
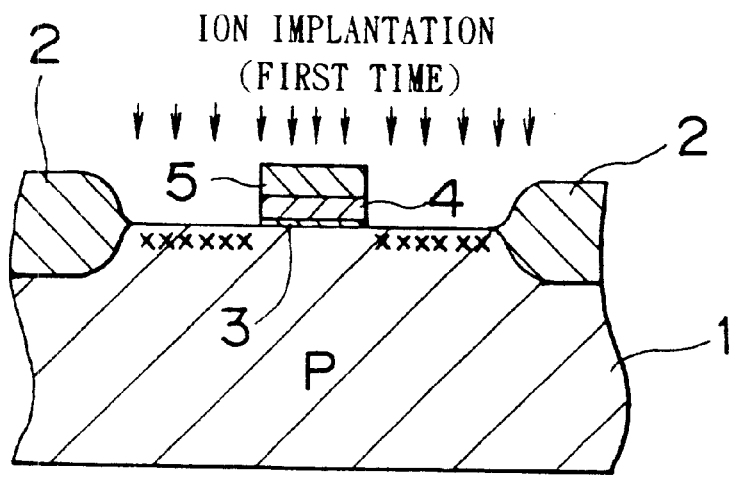

As shown in FIG. 3B, as the first ion implantation, n-type impurities, e.g., phosphorus (P), are ion-implanted into the surface region of a silicon semiconductor substrate 1 on both sides of the gate electrode 4 using the cap oxide film 5 as a mask while setting the acceleration energy at about 60 (keV) and the dose at a low concentration of about $5 \times 10^{12}$ to $5 \times 10^{13}$ $(1/cm^2)$, about $2 \times 10^{13}$ $(1/cm^2)$ in this case.

Figure 3C:
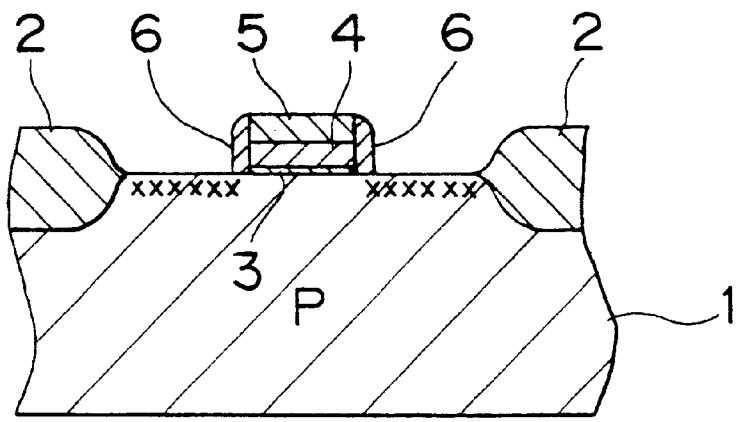
Figure 3D:
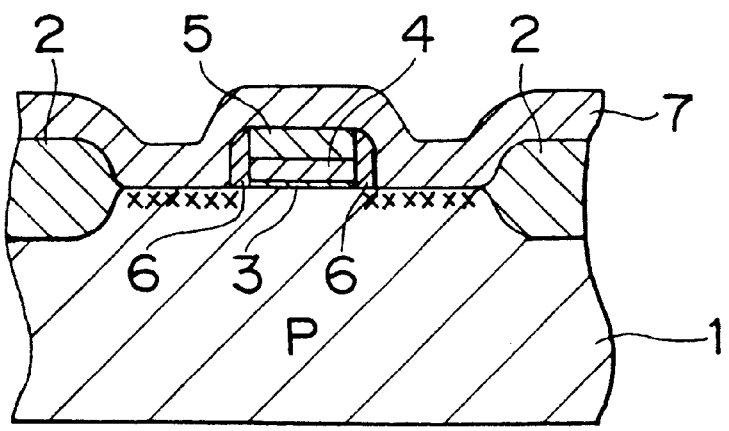

A silicon oxide film is deposited on the entire surface of the silicon semiconductor substrate 1 by, e.g., CVD. The entire surface of the silicon oxide film is subjected to anisotropic dry etching to leave the silicon oxide film on the side surfaces of the gate oxide film 3, the gate electrode 4, and the cap oxide film 5, thereby forming a side wall protective film 6 as shown in FIG. 3C. As shown in FIG. 3D, an undoped polysilicon film 7 having a thickness of about 200 nm is formed on the entire surface of the silicon semiconductor substrate 1, including the upper surface of the field oxide film 2, by, e.g., CVD.

Figure 3E:
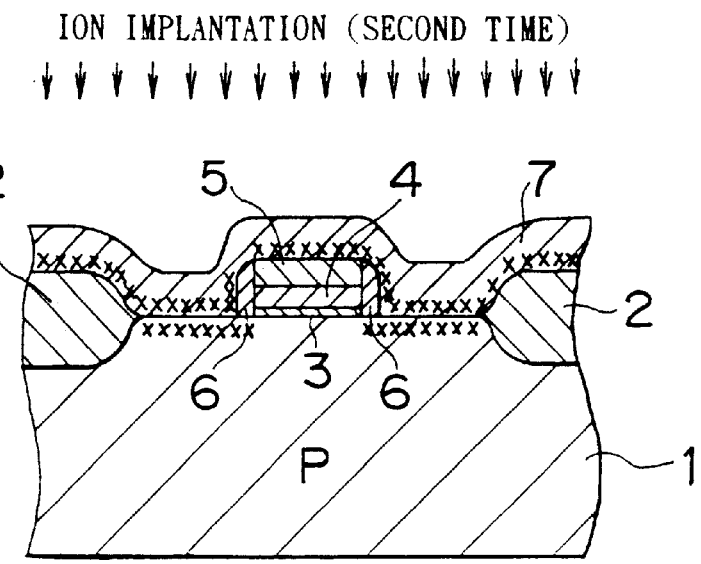

As shown in FIG. 3E, as the second ion implantation, n-type impurities, e.g., phosphorus (P), are ion-implanted into the polysilicon film 7. This ion implantation is performed while setting the acceleration energy at about 160 (kev) and the dose at a low concentration of about $1 \times 10^{12}$ to $1 \times 10^{14}$ $(1/cm^2)$, about $5 \times 10^{13}$ $(1/cm^2)$ in this case, such that the concentration peak is formed near the lower surface of the polysilicon film 7, and the impurities are present in about a lower ⅓ range of the thickness of the polysilicon film 7. The interface between the polysilicon film 7 and the silicon semiconductor substrate 1 is in a nondamaged state, i.e., in a nonamorphous state.

Figure 3F:
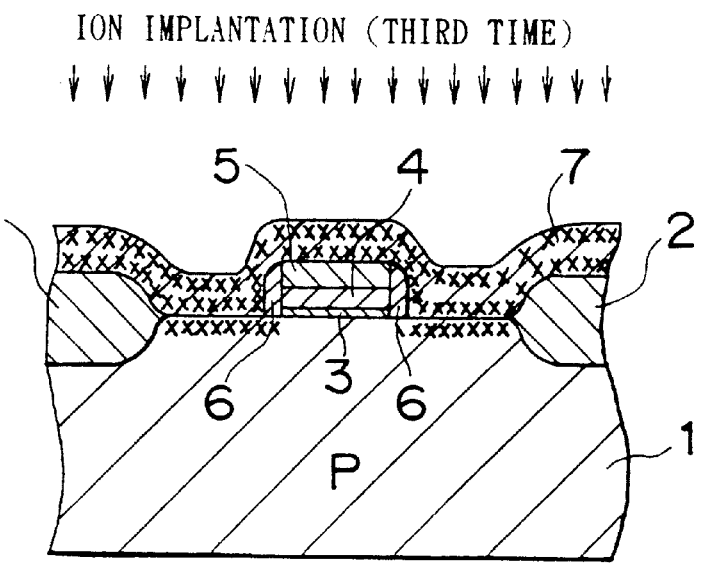

As shown in FIG. 3F, as the third ion implantation, n-type impurities, e.g., phosphorus (P), are ion-implanted into the polysilicon film 7. This ion implantation is performed while setting the acceleration energy at about 30 (kev) and the dose at a high concentration of about $1 \times 10^{15}$ to $1 \times 10^{16}$ $(1/cm^2)$, about $2 \times 10^{15}$ $(1/cm^2)$ in this case, such that the concentration peak is formed near the upper surface of the polysilicon film 7, and the impurities are present in about an upper ⅓ range of the thickness of the polysilicon film 7.

Figure 3G:
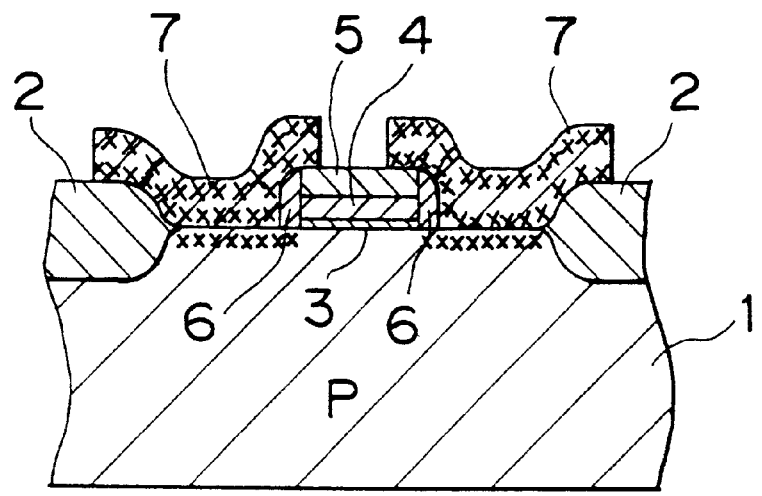

As shown in FIG. 3G, the polysilicon film 7 is patterned by photolithography and dry etching and separated on the cap oxide film 5 and the field oxide film 2.

Figure 3H:
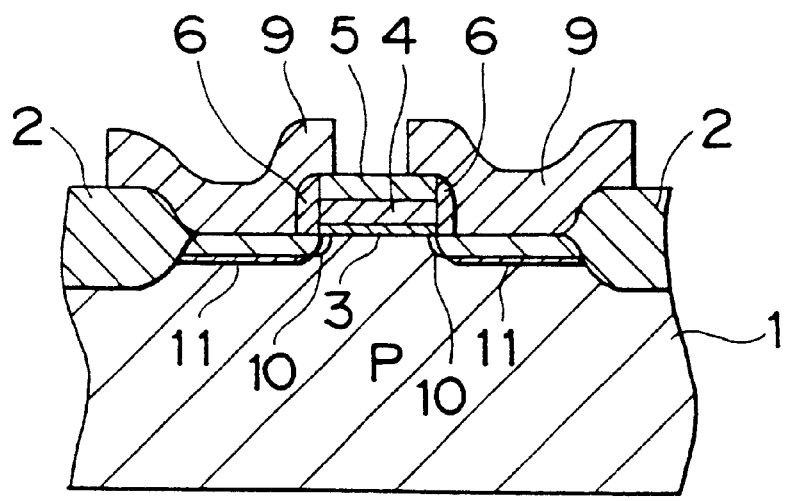

As shown in FIG. 3H, the silicon semiconductor substrate 1 is annealed at 600° C. or more, about 850° C. in this case, for 30 min. At this time, a pair of so-called LDD regions 10 each having a shallow junction are formed by the impurities of the first ion implantation.

Simultaneously, the relatively low-concentration impurities distributed by the second ion implantation are diffused into the silicon semiconductor substrate 1, so that a pair of impurity diffusion layers 11 serving as source and drain regions each having a lightly doped shallow junction (deeper than the LDD region 10) are formed to partially overlap the LDD regions 10.

As described above, when the dose for the second ion implantation is set within the range of about $1 \times 10^{12}$ to $1 \times 10^{14}$ $(1/cm^2)$, and phosphorus is ion-implanted such that the impurities are present in about the lower ⅓ range of the thickness of the polysilicon film 7, the impurity diffusion layers 11 can be formed to have a lightly doped shallow junction, as desired. In addition, ion implantation of phosphorus having a small diffusion coefficient is more effective to form the shallow junction. When arsenic (As) is to be ion-implanted in the second ion implantation, it is appropriate to set the acceleration energy at about 300 (keV) and the dose at about $1 \times 10^{14}$ $(1/cm^2)$.

On the other hand, the relatively high-concentration impurities distributed by the third ion implantation are diffused in the polysilicon film 7 by the above-described annealing. The high-concentration impurities are diffused to form lead-out electrodes 9. When the third ion implantation is performed such that the impurities are present in a sufficiently shallow portion near the upper surface of the polysilicon film 7, formation of the impurity diffusion layers 11 having a lightly doped shallow junction is not impeded by subsequent annealing.

As described above, when the dose for the third ion implantation is set within the range of about $1 \times 10^{15}$ to $1 \times 10^{16}$ $(1/cm^2)$, and phosphorus is ion-implanted such that the impurities are present in about the upper ⅓ range of the thickness of the polysilicon film 7, formation of the impurity diffusion layers 8 is not impeded, and the impurity concentration of the lead-out electrode 9 can be kept high. When arsenic (As) having a large diffusion coefficient is ion-implanted as impurities, the concentration of the lead-out electrode 9 can be raised within a wider area. When arsenic (As) is to be ion-implanted in the third ion implantation, it is appropriate to set the acceleration energy at about 30 (keV), and the dose at about $2 \times 10^{15}$ $(1/cm^2)$.

Since the impurity diffusion layers 11 each having an LDD structure with a shallow junction are formed, generation of hot carriers and the short channel effect are further suppressed. In addition, the resistance of each impurity diffusion layer 11 can be lowered.

Figure 4:
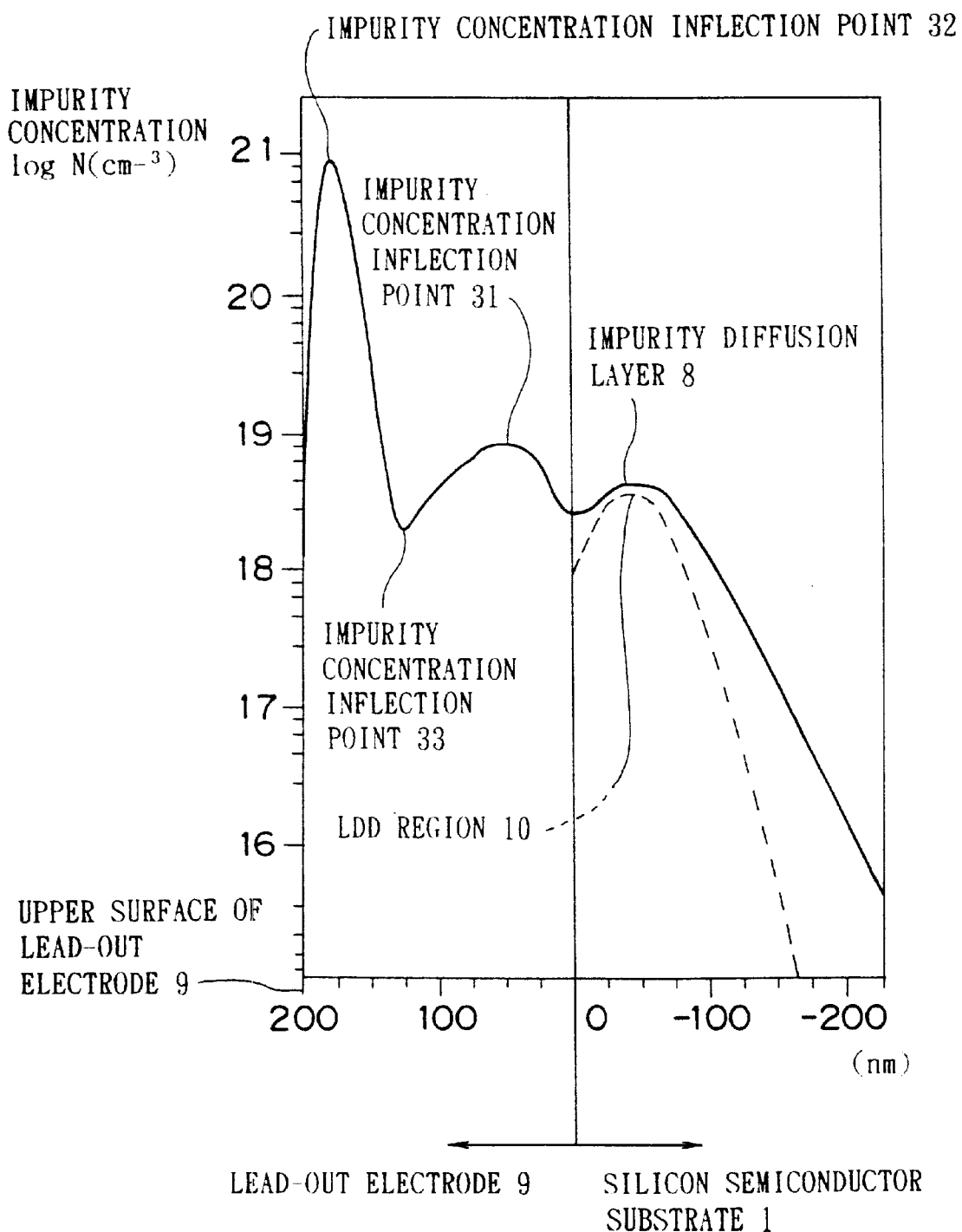
FIG. 4 is a graph showing the relationship between the impurity concentration and the depth from the surface in a lead-out electrode and a silicon semiconductor substrate of the MOS transistor according to the second embodiment.

FIG. 4 is a graph showing the relationship between the impurity concentration and the depth from the surface in the lead-out electrode 9 and the silicon semiconductor substrate 1 after annealing. After the second ion implantation, the impurity diffusion profile of the lead-out electrode 9 has an impurity concentration inflection point 31 where the impurity concentration exhibits a maximal value of about $1 \times 10$ $(1/cm^3)$ within about the ⅓ range of the thickness of the lead-out electrode 9 from the interface between the lead-out electrode 9 and the silicon semiconductor substrate 1.

The impurities ion-implanted by the second ion implantation are diffused into the silicon semiconductor substrate 1 by annealing, so that the impurity diffusion layers 11 each having a lightly doped shallow junction (deeper than the LDD region 10) are formed.

After the third ion implantation, the impurity diffusion profile of the lead-out electrode 9 has an impurity concentration inflection point 32 where the impurity concentration exhibits a maximal value of about $1 \times 10^{21}$ $(1/cm^3)$ within about the ⅓ range of the thickness of the lead-out electrode 9 from the upper surface of the lead-out electrode 9.

An impurity concentration inflection point 33 where the impurity concentration exhibits a minimal value is formed between the impurity concentration inflection points 31 and 32. Therefore, the impurities ion-implanted by the third ion implantation do not adversely affect diffusion of the impurities of the second ion implantation into the silicon semiconductor substrate 1.

The impurities are diffused throughout the lead-out electrode 9 by the second and third ion implantations, so that the resistance of the lead-out electrode 9 can be lowered.

Thereafter, an insulating interlayer is formed on the entire surface of the silicon semiconductor substrate 1. The insulating interlayer is reflowed to planarize the structure. Thereafter, a contact hole is formed to partially expose the surface of the lead-out electrode 9. Wiring layers are formed to fill the contact holes and to be connected to the impurity diffusion layers 11 through the lead-out electrode 9. Post-processing is performed, thus completing the MOS transistor.

As described above, in the second embodiment, impurities are ion-implanted into the surface region of the silicon semiconductor substrate 1 at a low concentration by the first ion implantation. Impurities are ion-implanted at a low concentration by the second ion implantation such that the concentration peak is formed near the lower surface of the polysilicon film 7, and the impurities are present in about the lower ⅓ range of the thickness of the polysilicon film 7. Thereafter, impurities are ion-implanted at a high concentration by the third ion implantation such that the concentration peak is formed near the upper surface of the polysilicon film 7, and the impurities are present in about the upper ⅓ range of the thickness of the polysilicon film 7.

Annealing is performed to diffuse the low-concentration impurities of the first ion implantation, so that the pair of so-called LDD regions 10 each having a shallow junction can be formed. The low-concentration impurities of the second ion implantation are diffused into the silicon semiconductor substrate 1, so that the pair of impurity diffusion layers 11 serving as source and drain regions each having a lightly doped shallow junction (deeper than the LDD region 10) can be formed to partially overlap the LDD regions 10. Simultaneously, the high-concentration impurities of the third ion implantation are diffused in the polysilicon film 7 by the above-described annealing. With this process, the lead-out electrode 9 can be formed by diffusing the high-concentration impurities.

Therefore, the impurity diffusion layers 11 each having an LDD structure with a shallow junction are formed to further suppress generation of hot carriers and the short channel effect. In addition, the resistance of the lead-out electrode 9 can be lowered.

Third Embodiment

The third embodiment of the present invention will be described next. In the third embodiment, a method of manufacturing a MOS transistor will be described as in the first and second embodiments. In the third embodiment, the present invention is applied to lower the resistance of the interface between a lead-out electrode connected to the source/drain region and a refractory metal layer formed on the lead-out electrode. FIGS. 5A to 5L are schematic sectional views showing steps in manufacturing the MOS transistor according to the third embodiment. The same reference numerals as in the MOS transistors of the first and second embodiments denote the same constituent elements in the third embodiment, and a detailed description thereof will be omitted.

Figure 5A:
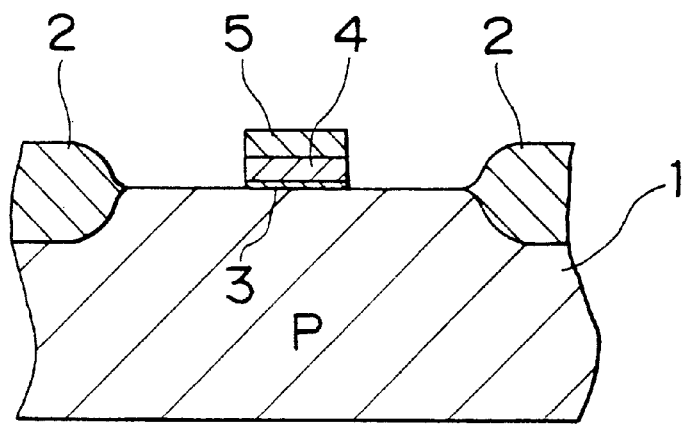
FIGS. 5A to 5L are schematic sectional views showing steps in manufacturing a MOS transistor according to the third embodiment.

In the third embodiment, as shown in FIG. 5A, a field oxide film 2 is formed, and thereafter, a band-shaped gate oxide film 3, a gate electrode 4, and a cap oxide film 5 are patterned, as in the first embodiment.

Figure 5B:
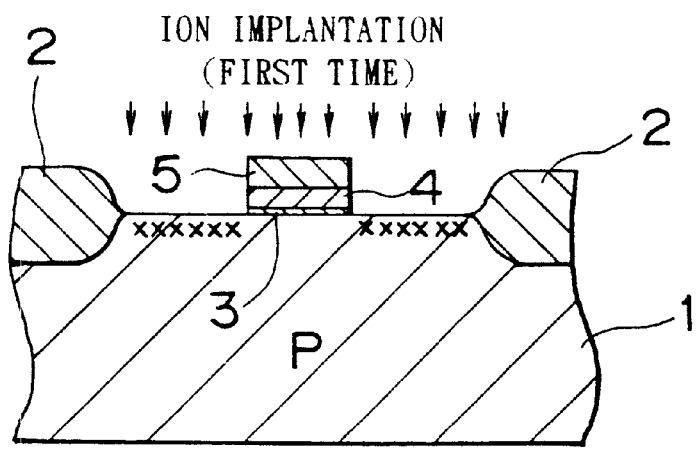

As shown in FIG. 5B, as the first ion implantation, n-type impurities, e.g., phosphorus (P), are ion-implanted into the surface region of a silicon semiconductor substrate 1 on both sides of the gate electrode 4 using the cap oxide film 5 as a mask while setting the acceleration energy at about 60 (kev) and the dose at a low concentration of about $2 \times 10^{13}$ (1/cm$^2$).

Figure 5C:
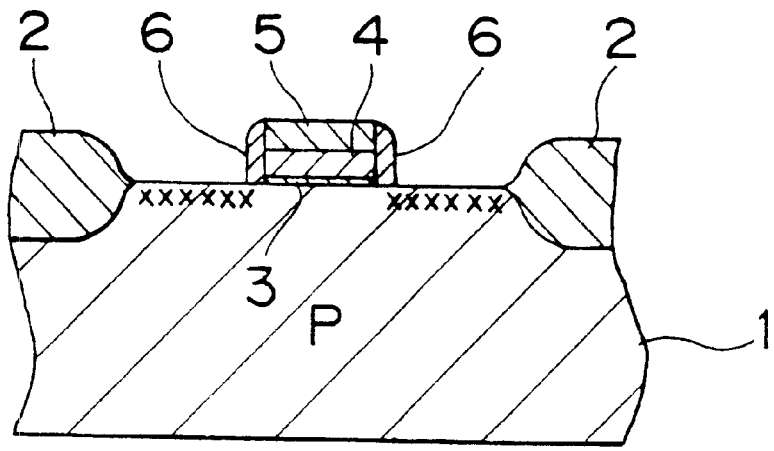

A silicon oxide film is deposited on the entire surface of the silicon semiconductor substrate 1 by, e.g., CVD. The entire surface of the silicon oxide film is subjected to anisotropic dry etching to leave the silicon oxide film on the side surfaces of the gate oxide film 3, the gate electrode 4, and the cap oxide film 5, thereby forming a side wall protective film 6 as shown in FIG. 5C.

Figure 5D:
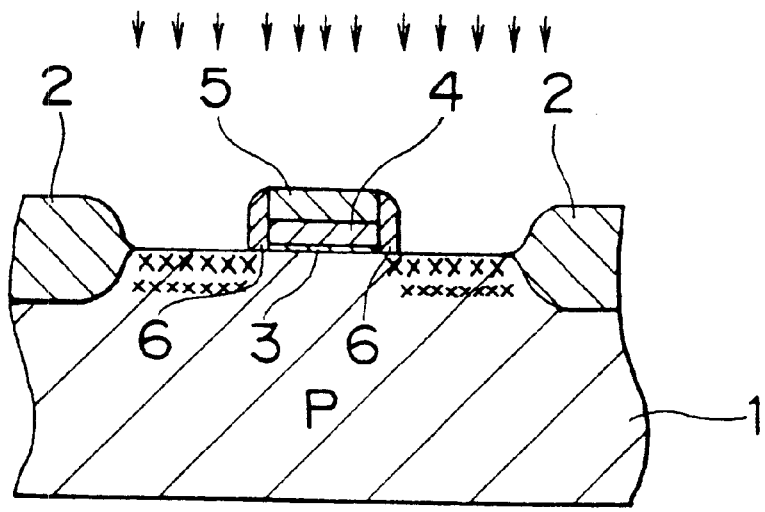

As shown in FIG. 5D, as the second ion implantation, n-type impurities, e.g., arsenic (As), are ion-implanted into the surface region of the silicon semiconductor substrate 1 on both sides of the side wall protective film 6 using the cap oxide film 5 and the side wall protective film 6 as a mask while setting the acceleration energy at about 60 (keV) and the dose at a high concentration of about $5 \times 10^{15}$ (1/cm$^2$).

Figure 5E:
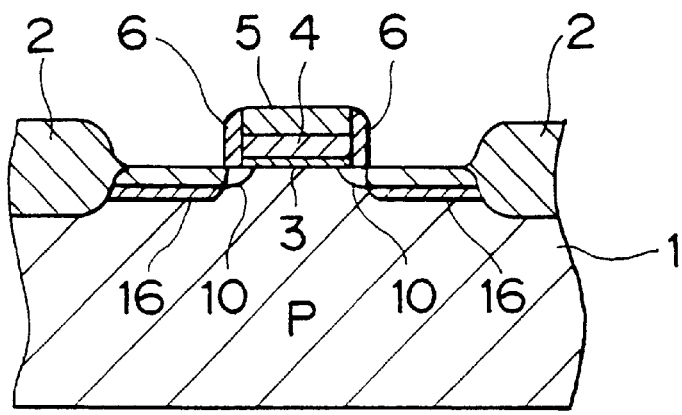

As shown in FIG. 5E, annealing is performed at a temperature of about 900° C. for about 30 min to diffuse the impurities in the silicon semiconductor substrate 1. At this time, a pair of so-called LDD regions 10 each having a shallow junction are formed by the impurities of the first ion implantation. Simultaneously, the relatively high-concentration impurities distributed by the second ion implantation are diffused to form a pair of impurity diffusion layers 16 serving as source and drain regions.

Figure 5F:
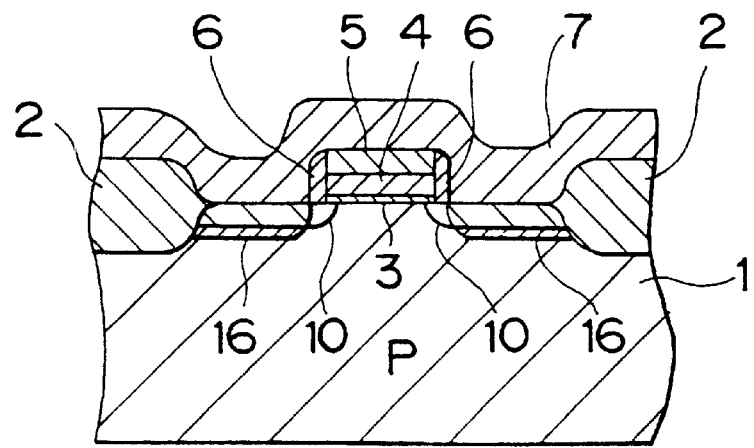

As shown in FIG. 5F, an undoped polysilicon film 7 having a thickness of about 250 nm is formed on the entire surface of the silicon semiconductor substrate 1, including the upper surface of the field oxide film 2, by, e.g., CVD.

Figure 5G:
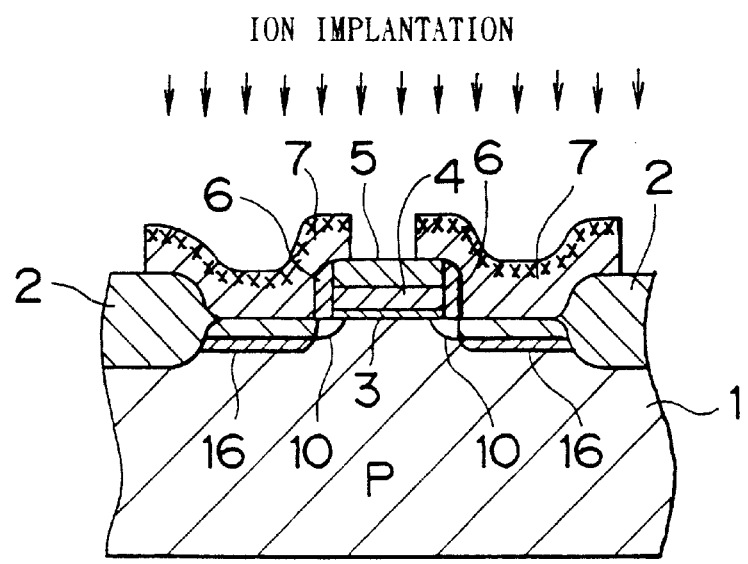

As shown in FIG. 5G, the polysilicon film 7 is patterned by photolithography and dry etching and separated on the cap oxide film 5 and the field oxide film 2. N-type impurities, e.g., phosphorus (P), are ion-implanted into the polysilicon film 7. This ion implantation is performed while setting the acceleration energy at about 30 (keV) and the dose at a high concentration of $1 \times 10^{15}$ (1/cm$^2$) or more, about $2 \times 10^{15}$ (1/cm$^2$) in this case, such that the concentration peak is formed near the upper surface of the polysilicon film 7, and the impurities are present in about an upper ⅓ range of the thickness of the polysilicon film 7.

Figure 5H:
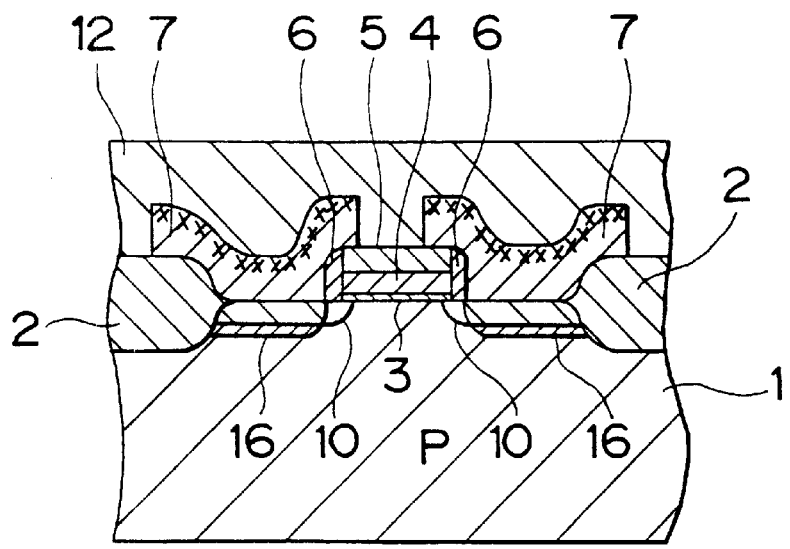

As shown in FIG. 5H, a silicon oxide film 12 serving as an insulating interlayer is formed on the entire surface of the silicon semiconductor substrate 1. Thereafter, the surface is planarized by chemical mechanical polishing (CMP).

Figure 5I:
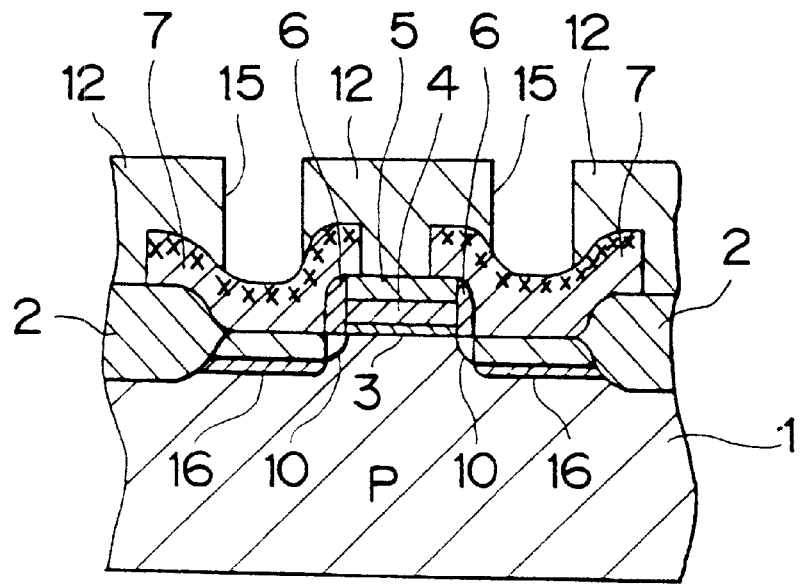

As shown in FIG. 5I, opening portions 15 are formed in the silicon oxide film 12 on the polysilicon film 7 by photolithography and dry etching. With this process, the polysilicon film 7 is exposed.

Figure 5J:
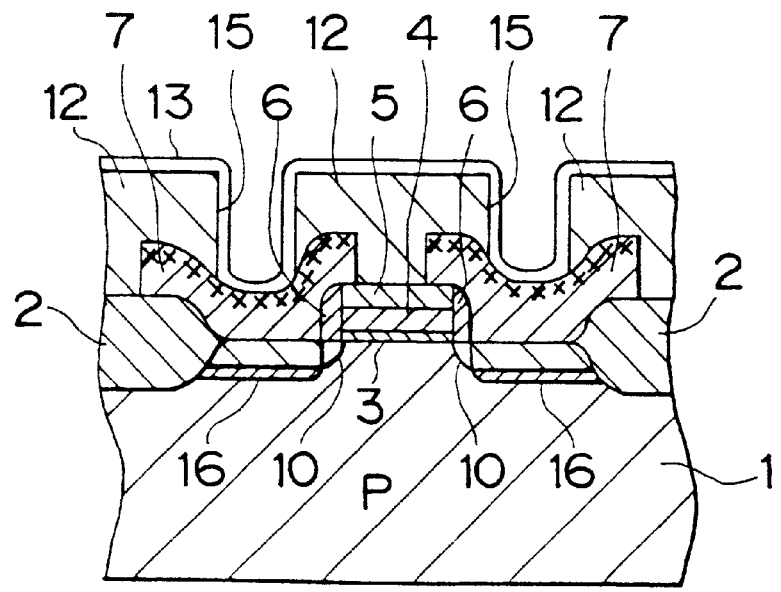

As shown in FIG. 5J, a tungsten (w) film 13 as a refractory metal film is formed on the entire surface of the silicon semiconductor substrate 1 including the inside of the opening portions 15 by sputtering.

Figure 5K:
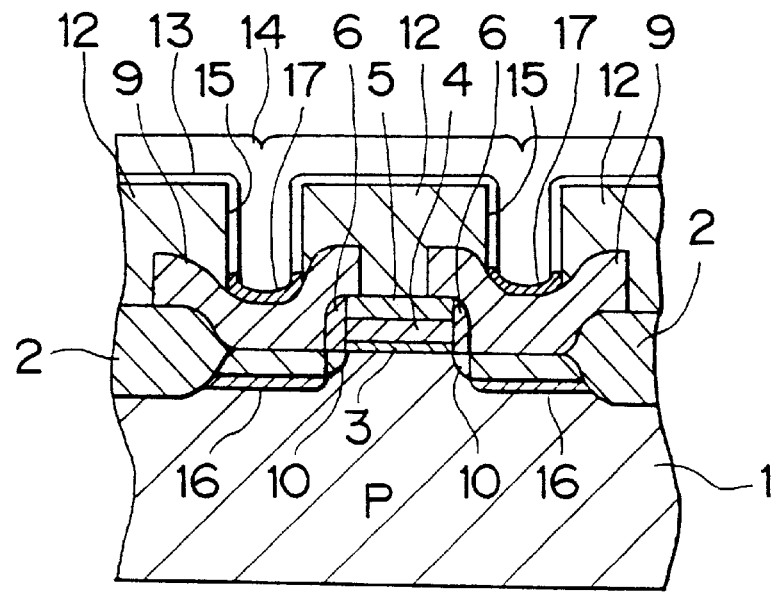

When annealing is performed, as shown in FIG. 5K, silicide reaction takes place between the tungsten film 13 and the polysilicon film 7 to form a tungsten silicide film 17. Simultaneously, the relatively high-concentration impurities distributed by the ion implantation are diffused in the polysilicon film 7 by the above-described annealing. The high-concentration impurities are diffused to form lead-out electrodes 9. Annealing for forming the LDD regions 10 and the impurity diffusion layers 16 may be performed simultaneously with annealing for forming the silicide.

As described above, since ion implantation is performed so that the concentration peak is formed near the upper surface of the polysilicon film 7, and the impurities are present in about the upper 1/3 range of the thickness of the polysilicon film 7, the impurity concentration of the lead-out electrode 9 can be kept high even when the impurities are diffused to the tungsten film 13 side. Therefore, the increase in electrical resistance at the interface between the lead-out electrode 9 and the tungsten silicide film 17 can be minimized.

Figure 5L:
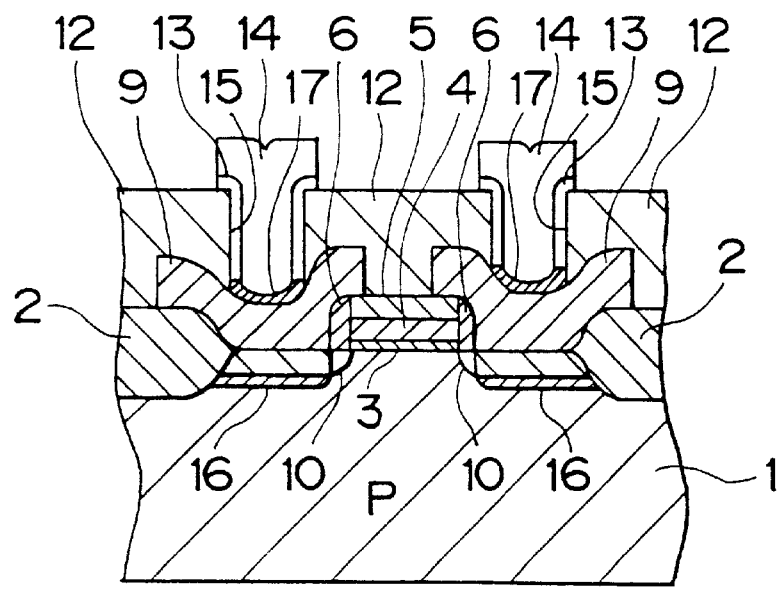

An aluminum wiring layer 14 is formed on the entire surface of the silicon semiconductor substrate 1 by sputtering. Postprocessing is performed, thus completing the MOS transistor as shown in FIG. 5L.

As described above, in the third embodiment, the impurities are ion-implanted at a high concentration such that the concentration peak is formed near the upper surface of the polysilicon film 7, and the impurities are present in about the upper 1/3 range of the thickness of the polysilicon film 7. Thereafter, the tungsten film 13 is formed on the polysilicon film 7, and annealing is performed to convert the tungsten film 13 into tungsten silicide.

In conversion to tungsten silicide, the impurities in the polysilicon film 7 are partially diffused to the tungsten film 13. However, since the impurity concentration in about the upper 1/3 range of the thickness of the polysilicon film 7 is made high, the electrical resistance of the polysilicon film 7 does not increase.

Therefore, the resistance of the lead-out electrode 9 can be lowered, and the tungsten silicide film 17 can be formed on the lead-out electrode 9. In the third embodiment, the silicide film is formed on the lead-out electrode 9 connected to the impurity diffusion layer 16. However, this embodiment can also be applied to formation of a silicide film on a gate electrode consisting of a normal silicon film.

Fourth Embodiment

Figure 6A:
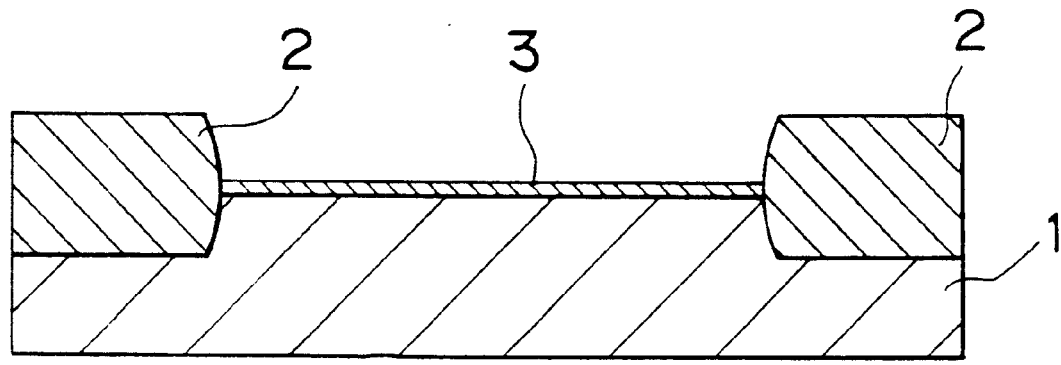
FIGS. 6A to 6I are schematic sectional views showing steps in manufacturing a MOS transistor according to the fourth embodiment.

The fourth embodiment of the present invention will be described next. In the fourth embodiment, a method of manufacturing a MOS transistor will be described, as in the first to third embodiments. The fourth embodiment is different from the above embodiments in the shape of the lead-out electrode. FIGS. 6A to 6I are schematic sectional views showing steps in manufacturing the MOS transistor according to the fourth embodiment. The same reference numerals as in the MOS transistors of the first to third embodiments denote the same constituent elements in the fourth embodiment, and a detailed description thereof will be omitted. In the fourth embodiment, as shown in FIG. 6A, a field oxide film 2 is formed, and thereafter, a gate oxide film 3 is formed, as in the first embodiment. Instead of forming the field oxide film 2, a field shield element isolation structure burying a conductive film in an oxide film may be formed by a so-called field shield element isolation method.

Figure 6B:
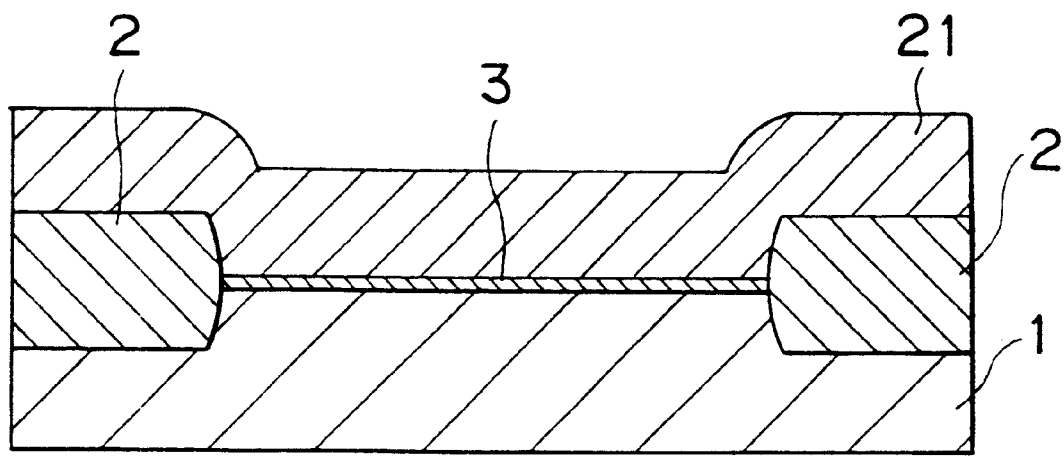

As shown in FIG. 6B, an n$^+$-type polysilicon film 21 having a predetermined thickness larger than the height of the field oxide film 2 from the silicon semiconductor substrate 1 is deposited by CVD to cover the gate oxide film 3 and the field oxide film 2.

Figure 6C:
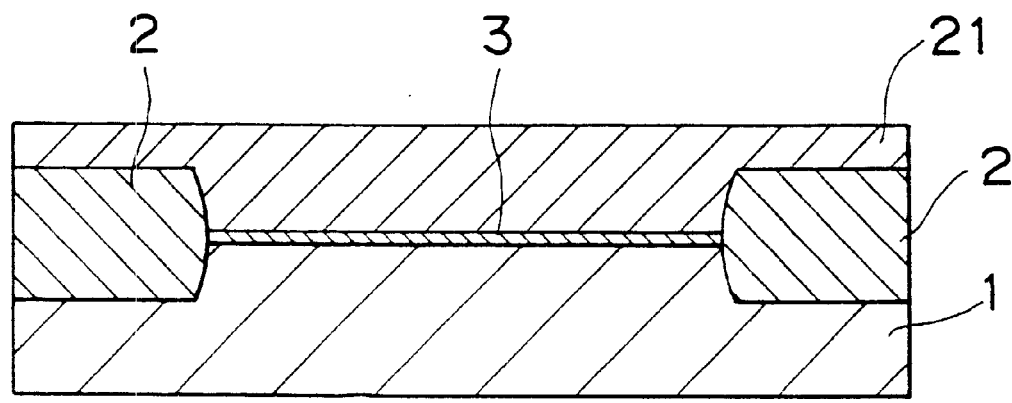

As shown in FIG. 6C, the polysilicon film 21 is subjected to surface polishing, chemical mechanical polishing, (CMP) in this case, to planarize the surface. In this instance, polishing is performed so that the polysilicon film 21 having the predetermined thickness is left on the field oxide film 2.

Figure 6D:
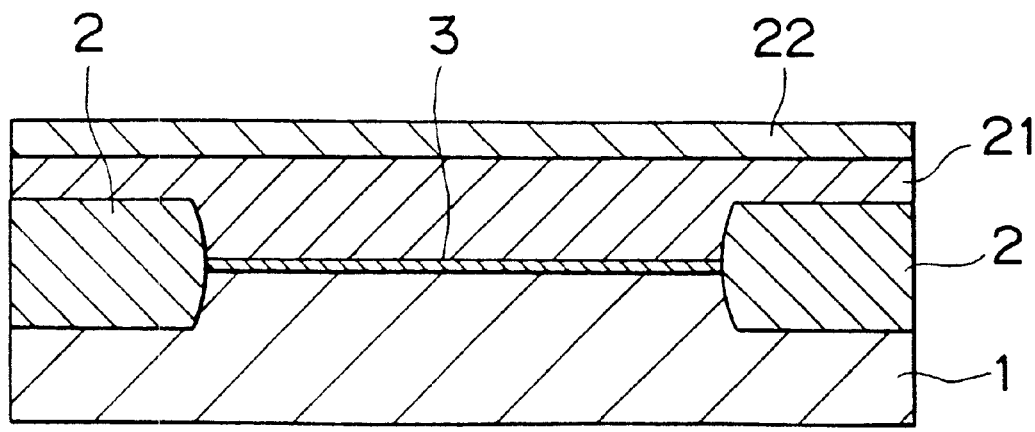

As shown in FIG. 6D, a silicon oxide film 22 is deposited on the planarized polysilicon film 21 by CVD.

Figure 6E:
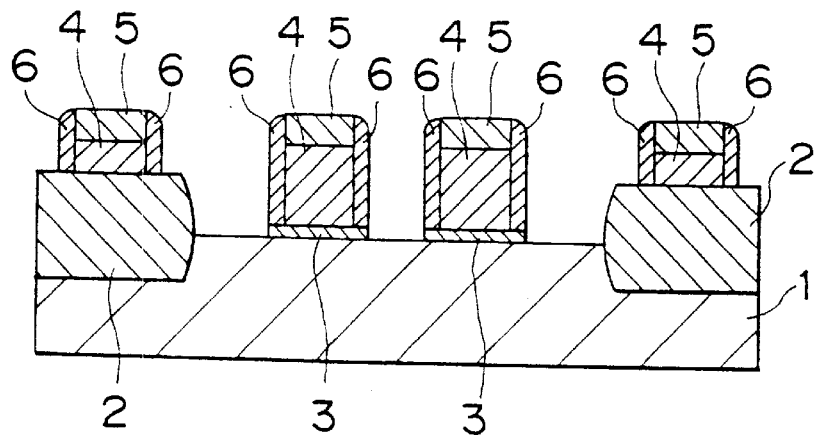

As shown in FIG. 6E, the silicon oxide film 22 and the polysilicon film 21 are patterned by photolithography and dry etching to form, on the element formation region and the field oxide film 2, gate electrodes (gate interconnections) 4 having a predetermined shape such that cap insulating films 5 consisting of the silicon oxide film 22 have upper surfaces substantially flush with each other, i.e., the gate electrodes 4 consisting of the polysilicon film 21 have upper surfaces substantially flush with each other.

Next, a silicon oxide film is deposited on the entire surface by CVD to cover the gate electrodes 4 (gate interconnections) and the cap insulating films 5 on the element formation region and the field oxide film 2. The entire surface of the silicon oxide film is subjected to anisotropic dry etching such as RIE to remove the gate oxide film 3 between the gate electrodes 4 in the element formation region and leave the silicon oxide film on the side surfaces of the gate electrodes 4 and the cap insulating films 5, thereby forming side wall protective films 6.

Figure 6F:
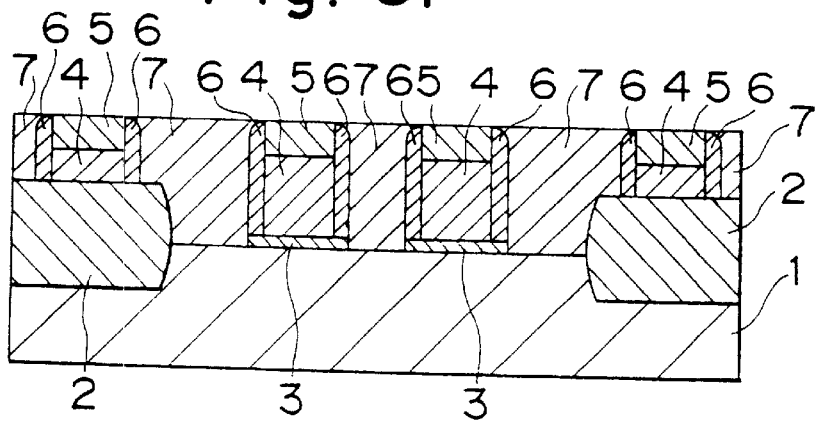

As shown in FIG. 6F, an undoped polysilicon film 7 having a thickness of about 250 nm is formed by CVD on the entire surface of the silicon semiconductor substrate 1 and the field oxide film 2. The polysilicon film 7 is subjected to surface polishing, chemical mechanical polishing (CMP) in this case, using the cap insulating films 5 on the gate electrodes 4 as a stopper until the cap insulating films 5 are exposed, thereby planarizing the surface. At this time, the polysilicon film 7 is separated between the cap insulating films 5 on the adjacent gate electrodes 4.

Figure 6G:
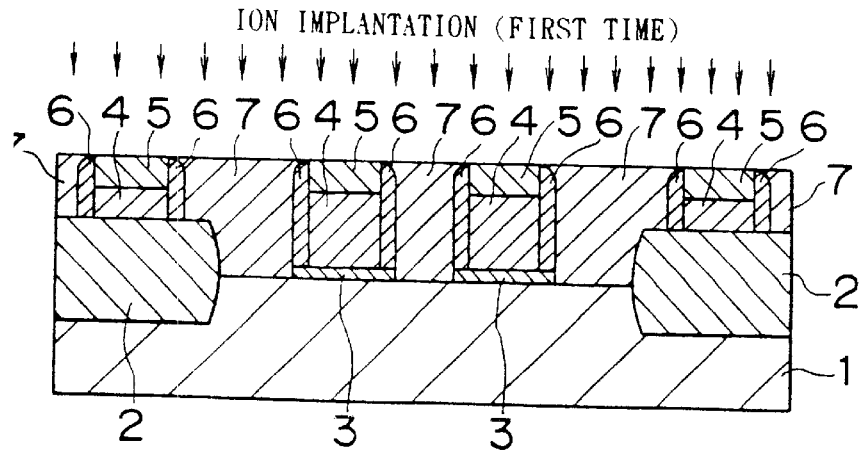

As shown in FIG. 6G, as the first ion implantation, n-type impurities, e.g., phosphorus (P), are ion-implanted into the polysilicon film 7. This ion implantation is performed while setting the acceleration energy at about 160 (kev) and the dose at a low concentration of about $1 \times 10^{12}$ to $1 \times 10^{14}$ (1/cm$^2$), about $5 \times 10^{13}$ (1/cm$^2$) in this case, such that the concentration peak is formed near the interface between the polysilicon film 7 and the silicon semiconductor substrate 1, and the impurities are present in about a lower 1/3 range of the thickness of the polysilicon film 7. The interface between the polysilicon film 7 and the silicon semiconductor substrate 1 is in a nondamaged state, i.e., in a nonamorphous state.

Figure 6H:
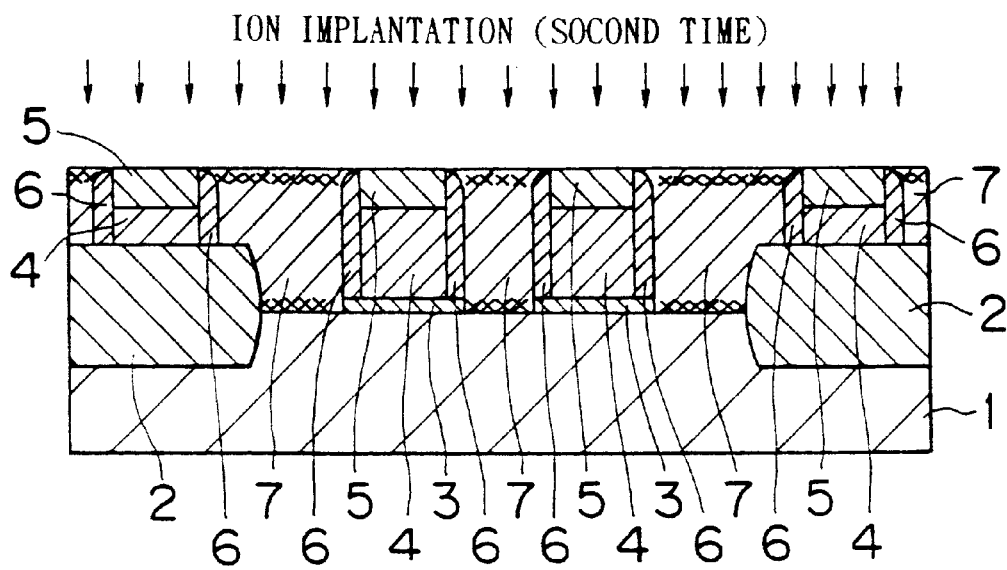

As shown in FIG. 6H, as the second ion implantation, n-type impurities, e.g., phosphorus (P), are ion-implanted into the polysilicon film 7. This ion implantation is performed while setting the acceleration energy at about 30 (kev) and the dose at a high concentration of about $1 \times 10^{15}$ to $1 \times 10^{16}$ (1/cm$^2$), about $2 \times 10^{15}$ (1/cm$^2$) in this case, such that the concentration peak is formed near the upper surface of the polysilicon film 7, and the impurities are present in about an upper 1/3 range of the thickness of the polysilicon film 7.

Figure 6I:
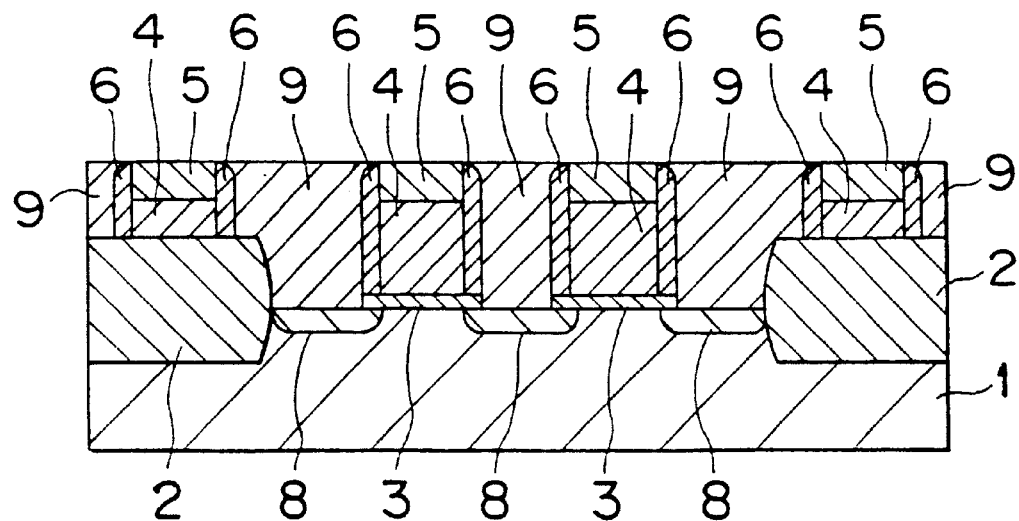

As shown in FIG. 6I, the silicon semiconductor substrate 1 is annealed at 600° C. or more, about 850° C. in this case, for 30 min. At this time, the relatively low-concentration impurities distributed by the first ion implantation are diffused into the silicon semiconductor substrate 1 to form a pair of impurity diffusion layers 8 serving as source and drain regions each having a lightly doped shallow junction.

As described above, when the dose for the first ion implantation is set within the range of about $1 \times 10^{12}$ to $1 \times 10^{14}$ (1/cm$^2$), and phosphorus is ion-implanted such that the impurities are present in about the lower 1/3 range of the thickness of the polysilicon film 7, the impurity diffusion layers 8 can be formed to have a lightly doped shallow junction, as desired. In addition, ion implantation of phosphorus having a small diffusion coefficient is more effective to form the shallow junction. When arsenic (As) is to be ion-implanted in the first ion implantation, it is appropriate to set the acceleration energy at about 300 (kev) and the dose at about $1\times10^{14}$ (1/cm$^2$).

On the other hand, the relatively high-concentration impurities distributed by the second ion implantation are diffused in the separated polysilicon films 7 by the above-described annealing. The high-concentration impurities are diffused to form lead-out electrodes 9. Since the surface of each polysilicon film 7 is planarized, the impurities are almost uniformly diffused in the lead-out electrode 9. When the second ion implantation is performed such that the impurities are present in a sufficiently shallow portion near the upper surface of the polysilicon film 7, formation of the impurity diffusion layers 8 having a lightly doped shallow junction is not impeded by subsequent annealing.

As described above, when the dose for the second ion implantation is set within the range of about $1\times10^{15}$ to $1\times10^{16}$ (1/cm$^2$), and phosphorus is ion-implanted such that the impurities are present in about the upper ⅓ range of the thickness of the polysilicon film 7, formation of the impurity diffusion layers 8 is not impeded, and the impurity concentration of the lead-out electrode 9 can be kept high. When arsenic (As) having a large diffusion coefficient is ion-implanted as impurities, the concentration of the lead-out electrode 9 can be raised within a wider area. When arsenic (As) is to be ion-implanted in the second ion implantation, it is appropriate to set the acceleration energy at about 30 (kev), and the dose at about $2\times10^{15}$ (1/cm$^2$).

Since the impurity diffusion layers 8 each having a shallow junction are formed, generation of hot carriers and the short channel effect are suppressed. In addition, the resistance of each impurity diffusion layer 8 can be lowered.

Figure 7:
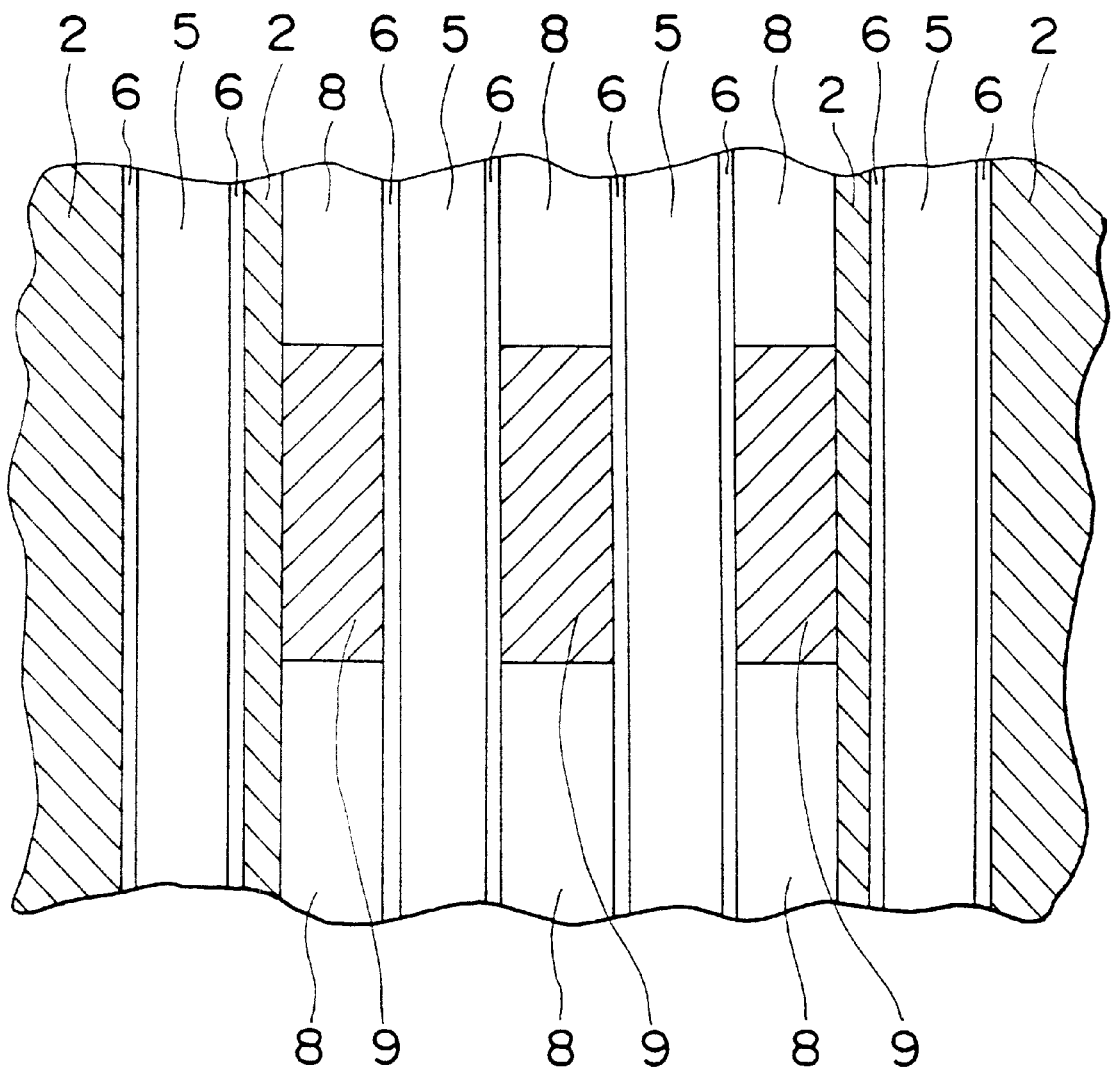
FIG. 7 is a plan view of the MOS transistor according to the fourth embodiment.

Thereafter, the lead-out electrode 9 is patterned into a predetermined shape on the impurity diffusion layer 8, as shown in the plan view of FIG. 7.

Thereafter, an insulating interlayer is formed on the entire surface of the silicon semiconductor substrate 1. The insulating interlayer is reflowed to planarize the structure. Thereafter, a contact hole is formed to partially expose the surface of the lead-out electrode 9. Wiring layers are formed to fill the contact holes and to be connected to the impurity diffusion layers 8 through the lead-out electrode 9. Postprocessing is performed, thus completing the MOS transistor.

As described above, in the fourth embodiment, after the polysilicon film 7 is formed, the polysilicon film 7 is polished by chemical mechanical polishing (CMP) using the cap insulating films 5 as a stopper, thereby planarizing the surface.

Impurities are ion-implanted at a low concentration by the first ion implantation such that the concentration peak is formed near the lower surface of the polysilicon film 7, and the impurities are present in about the lower ⅓ range of the thickness of the polysilicon film 7. Thereafter, impurities are ion-implanted at a high concentration by the second ion implantation such that the concentration peak is formed near the upper surface of the polysilicon film 7, and the impurities are present in about the upper ⅓ range of the thickness of the polysilicon film 7.

Annealing is performed to diffuse the low-concentration impurities of the first ion implantation into the silicon semiconductor substrate 1. With this process, the pair of impurity diffusion layers 8 serving as source and drain regions each having a lightly doped shallow junction can be formed. Simultaneously, the high-concentration impurities of the second ion implantation are diffused in the polysilicon film 7 by the above-described annealing. With this process, the lead-out electrode 9 can be formed by diffusing the high-concentration impurities. At this time, since the surface of the polysilicon film 7 is planarized, the impurities can be almost uniformly diffused in the lead-out electrode 9 by annealing.

Therefore, the impurity diffusion layers 8 each having a shallow junction are formed to suppress generation of hot carriers and the short channel effect. In addition, the resistance of the lead-out electrode 9 can be almost uniformly lowered.

Fifth Embodiment

Figure 8A:
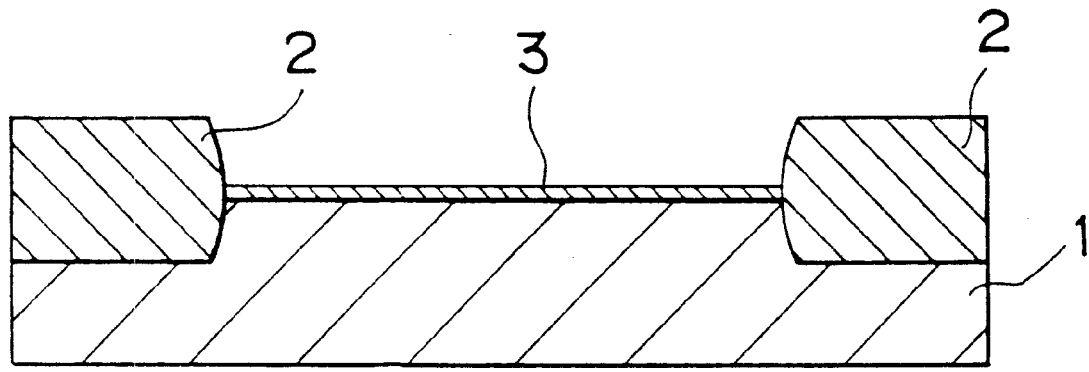
FIGS. 8A to 8O are schematic sectional views showing steps in manufacturing a MOS transistor according to the fifth embodiment.

The fifth embodiment of the present invention will be described next. In the fifth embodiment, a method of manufacturing a MOS transistor will be described, as in the first to fourth embodiments. However, unlike the fourth embodiment, the resistance of the lead-out electrode is made much lower, and a refractory metal film to be converted into a silicide is formed on the lead-out electrode. FIGS. 8A to 8O are schematic sectional views showing steps in manufacturing the MOS transistor according to the fifth embodiment. The same reference numerals as in the MOS transistors of the first to fourth embodiments denote the same constituent elements in the fifth embodiment, and a detailed description thereof will be omitted.

In the fifth embodiment, as shown in FIG. 8A, a field oxide film 2 is formed, and thereafter, a gate oxide film 3 is formed, as in the first embodiment. Instead of forming the field oxide film 2, a field shield element isolation structure burying a conductive film in an oxide film may be formed by a so-called field shield element isolation method.

Figure 8B:
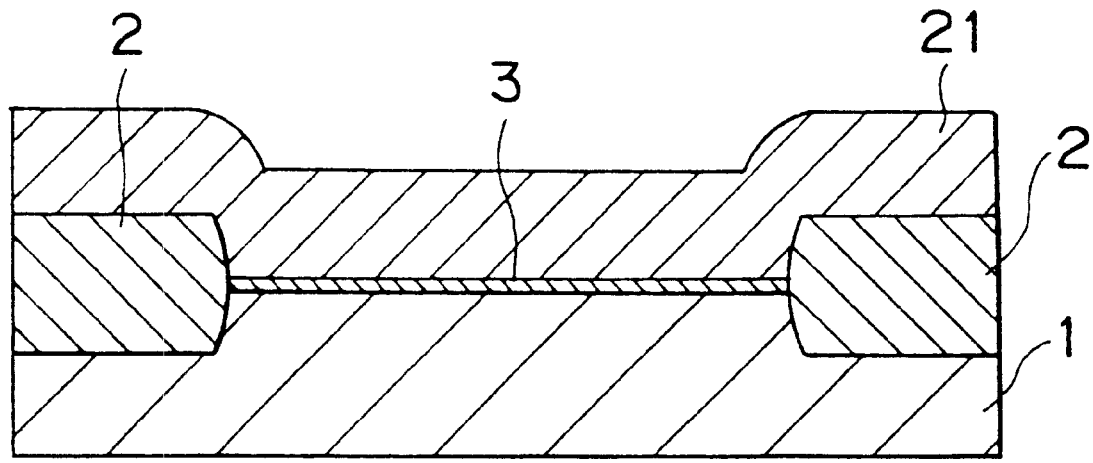

As shown in FIG. 8B, an n$^+$-type polysilicon film 21 having a predetermined thickness larger than the height of the field oxide film 2 from a silicon semiconductor substrate 1 is deposited by CVD to cover the gate oxide film 3 and the field oxide film 2.

Figure 8C:
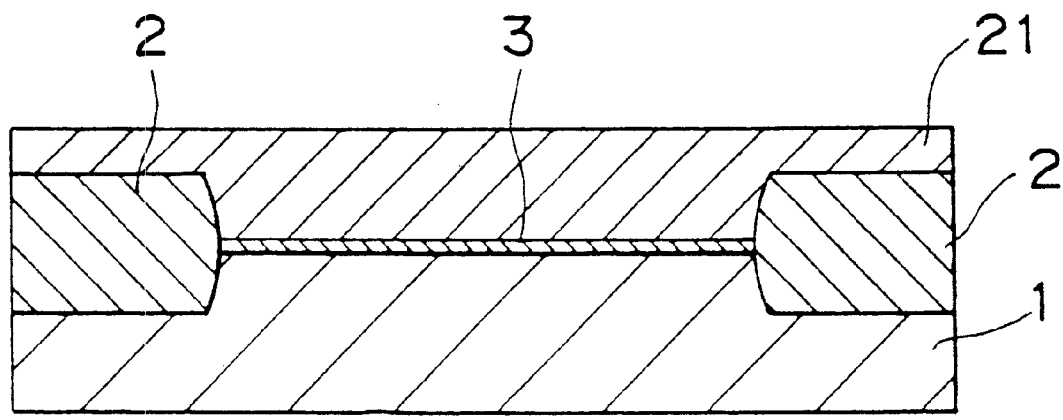

As shown in FIG. 8C, the polysilicon film 21 is subjected to surface polishing, chemical mechanical polishing (CMP) in this case, to planarize the surface. In this instance, polishing is performed so that the polysilicon film 21 having the predetermined thickness is left on the field oxide film 2.

Figure 8D:
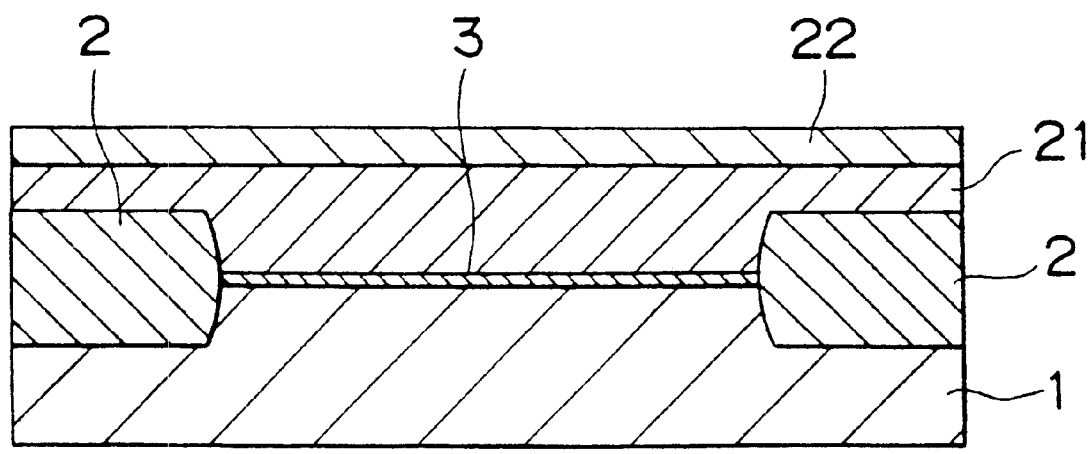

As shown in FIG. 8D, a silicon oxide film 22 is deposited on the planarized polysilicon film 21 by CVD.

Figure 8E:
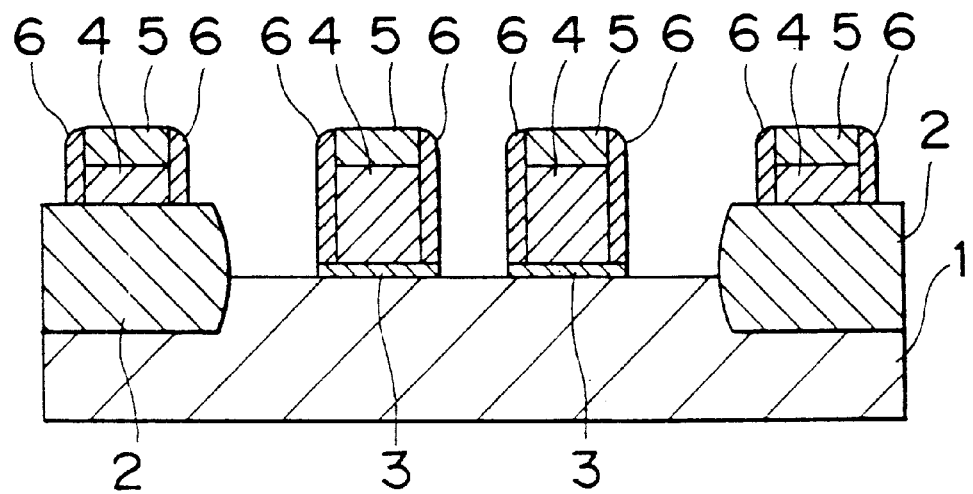

As shown in FIG. 8E, the silicon oxide film 22 and the polysilicon film 21 are patterned by photolithography and dry etching to form, on the element formation region and the field oxide film 2, gate electrodes (gate interconnections) 4 having a predetermined shape such that cap insulating films 5 consisting of the silicon oxide film 22 have upper surfaces substantially flush with each other, i.e., the gate electrodes 4 consisting of the polysilicon film 21 have upper surfaces substantially flush with each other.

Next, a silicon oxide film is deposited on the entire surface by CVD to cover the gate electrodes 4 (gate interconnections) and the cap insulating films 5 on the element formation region and the field oxide film 2. The entire surface of the silicon oxide film is subjected to anisotropic dry etching such as RIE to remove the gate oxide film 3 between the gate electrodes 4 in the element formation region and leave the silicon oxide film on the side surfaces of the gate electrodes 4 and the cap insulating films 5, thereby forming side wall protective films 6.

Figure 8F:
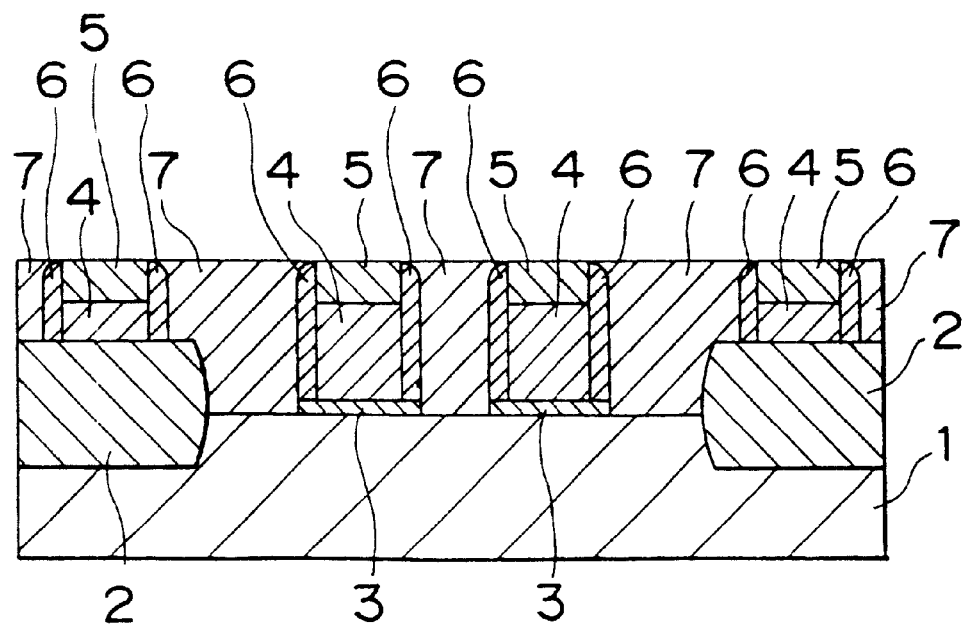
Figure 8G:
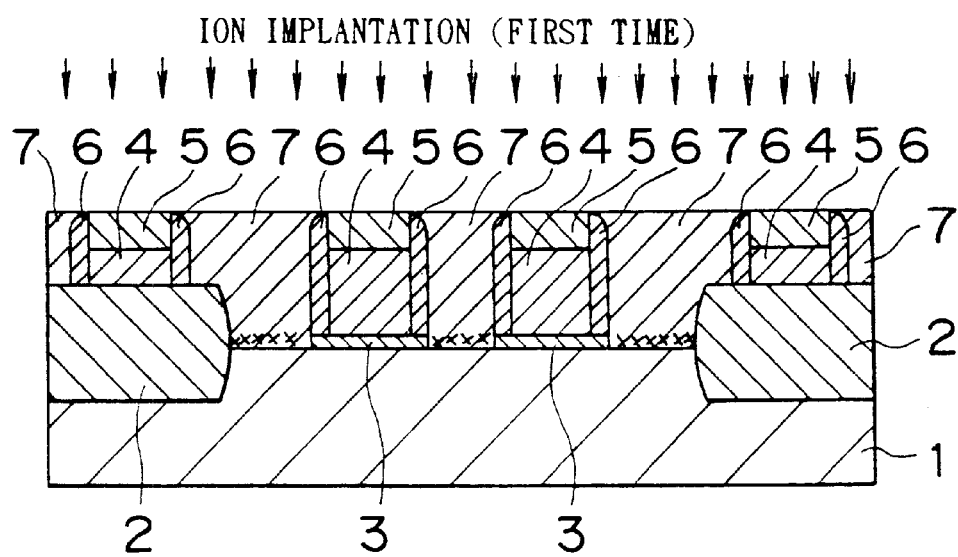

As shown in FIG. 8F, an undoped polysilicon film 7 having a thickness of about 250 nm is formed by CVD on the entire surface of the silicon semiconductor substrate 1 and the field oxide film 2. The polysilicon film 7 is subjected to surface polishing, chemical mechanical polishing (CMP) in this case, using the cap insulating films 5 on the gate electrodes 4 as a stopper until the cap insulating films 5 are exposed, thereby planarizing the surface. At this time, the polysilicon film 7 is separated between the cap insulating films 5 on the adjacent gate electrodes 4. As shown in FIG. 8G, as the first ion implantation, n-type impurities, e.g., phosphorus (P) are ion-implanted into the polysilicon film 7. This ion implantation is performed while setting the acceleration energy at about 160 (kev) and the dose at a low concentration of about $1\times10^{12}$ to $1\times10^{14}$ (1/cm$^2$), about $5\times10^{13}$ (1/cm$^2$) in this case, such that the concentration peak is formed near the interface between the polysilicon film 7 and the silicon semiconductor substrate 1, and the impurities are present in about a lower ⅓ range of the thickness of the polysilicon film 7. The interface between the polysilicon film 7 and the silicon semiconductor substrate 1 is set in a nondamaged state, i.e., in a nonamorphous state.

Figure 8H:
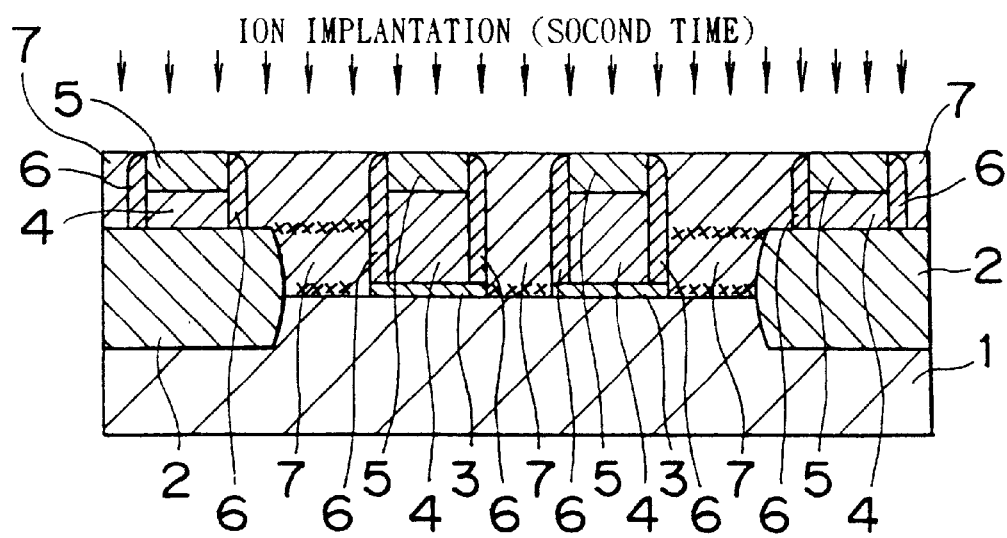

Next, as shown in FIG. 8H, as the second ion implantation, n-type impurities, e.g., phosphorus (P), are ion-implanted into the polysilicon film 7. This ion implantation is performed while setting the acceleration energy at about 100 (kev) and the dose at an intermediate concentration of about $1\times10^{14}$ (1/cm$^2$), about $2\times10^{14}$ (1/cm$^2$) in this case, such that the concentration peak is formed almost at the center in the direction of thickness of the polysilicon film 7, and the impurities are present in about a ⅓ range of the thickness of the polysilicon film 7.

Figure 8I:
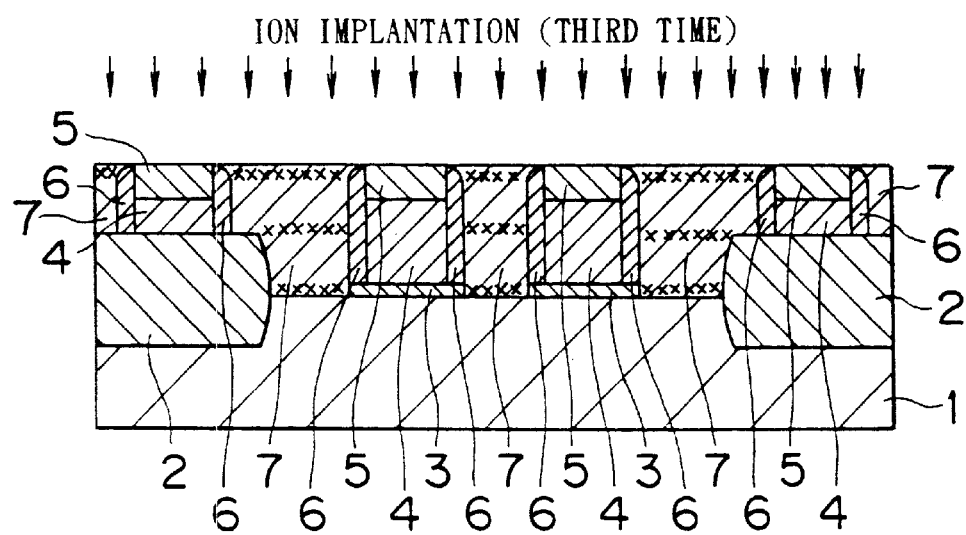

As shown in FIG. 8I, as the third ion implantation, n-type impurities, e.g., phosphorus (P), are ion-implanted into the polysilicon film 7. This ion implantation is performed while setting the acceleration energy at about 30 (keV) and the dose at a high concentration of about $1\times10^{15}$ to $1\times10^{16}$ (1/cm$^2$), about $2\times10^{15}$ (1/cm$^2$) in this case, such that the concentration peak is formed near the upper surface of the polysilicon film 7, and the impurities are present in about an upper ⅓ range of the thickness of the polysilicon film 7.

Figure 8J:
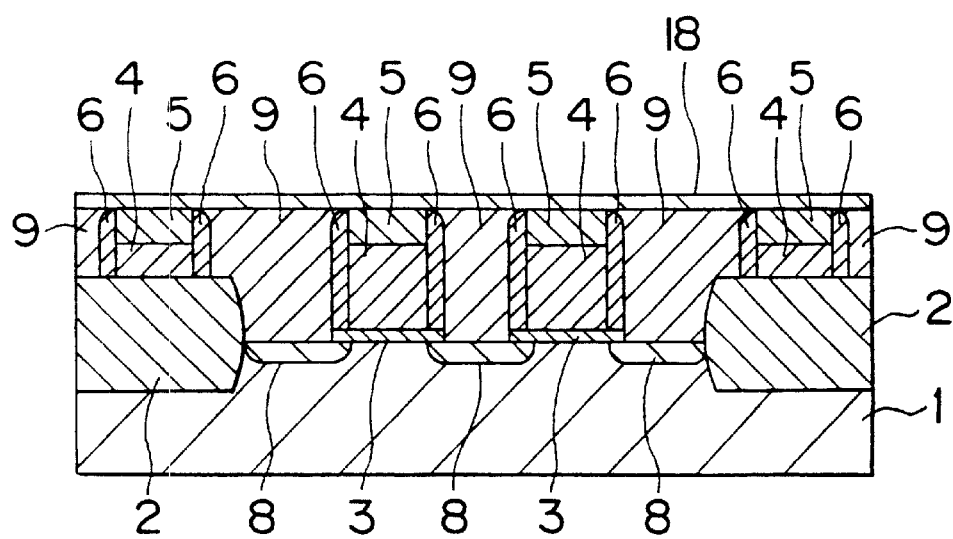

As shown in FIG. 8J, the silicon semiconductor substrate 1 is annealed at 600° C. or more, about 850° C. in this case, for 30 min. At this time, the relatively low-concentration impurities distributed by the first ion implantation are diffused into the silicon semiconductor substrate 1 to form a pair of impurity diffusion layers 8 serving as source and drain regions each having a lightly doped shallow junction.

As described above, when the first ion implantation is performed while setting the dose within the range of about $1\times10^{12}$ to $1\times10^{14}$ (1/cm$^2$) such that the impurities are present in about the lower ⅓ range of the thickness of the polysilicon film 7, the impurity diffusion layers 8 can be formed to have a lightly doped shallow junction, as desired. In addition, ion implantation of phosphorus having a small diffusion coefficient is more effective to form the shallow junction.

On the other hand, the relatively high- and intermediate-concentration impurities distributed by the second and third ion implantations are diffused in the separated polysilicon films 7 by the above-described annealing. The high-concentration impurities are diffused to form lead-out electrodes 9. Since the surface of each polysilicon film 7 is planarized, the impurities are almost uniformly diffused in the lead-out electrode 9. Even in case wherein the polysilicon film 7 is thick, since the second ion implantation is performed aiming at the center of the polysilicon film 7 in the direction of thickness, the impurity concentration near the center of the lead-out electrode 9 in the direction of thickness can be prevented from being lowered, so that the resistance can be lowered. When the second ion implantation is performed so that the impurities are- distributed almost at the center of the polysilicon film 7 in the direction of its thickness, formation the impurity diffusion layers 8 having a lightly doped shallow junction is not impeded by subsequent annealing.

When the polysilicon film 7 is much thicker, ion implantation may be performed in multiple steps. When ion implantation is to be performed in multiple steps, ion implantation may be performed stepwise such that the concentration of the ion-implanted impurities increases from the lower layer to the upper layer of the polysilicon film 7. With this process, formation of the impurity diffusion layers 8 having a lightly doped shallow junction is not impeded.

As described above, when the dose for the third ion implantation is set within the range of about $1\times10^{15}$ to $1\times10^{16}$ (1/cm$^2$), and phosphorus is ion-implanted such that the impurities are present in about the upper ⅓ range of the thickness of the polysilicon film 7, formation of the impurity diffusion layers 8 is not impeded, and the impurity concentration of the lead-out electrode 9 can be kept high.

As in the fourth embodiment, in the three ion implantation, arsenic (AS) may be ion-implanted.

Since the impurity diffusion layers 8 each having a shallow junction are formed, generation of hot carriers and the short channel effect are suppressed. In addition, the resistance of the lead-out electrode 9 can be almost uniformly lowered.

After formation of the lead-out electrode 9, as shown in FIG. 8J, a titanium (Ti) film 18 is formed on the entire surface of the silicon semiconductor substrate 1 by sputtering. Annealing is performed to convert the junction interface between the lead-out electrode 9 and the titanium film 18 into titanium silicide, thereby forming a titanium silicide (TiSi$_2$) film 19.

The impurities are ion-implanted near the surface of the polysilicon film 7 at a high concentration by the third ion implantation and diffused by annealing to form the lead-out electrode 9. Even when the impurities are diffused from the lead-out electrode 9 to the titanium film 18 by annealing in formation of the silicide film, the increase in electrical resistance at the interface between the lead-out electrode 9 and the titanium silicide film 19 can be minimized.

Figure 8K:
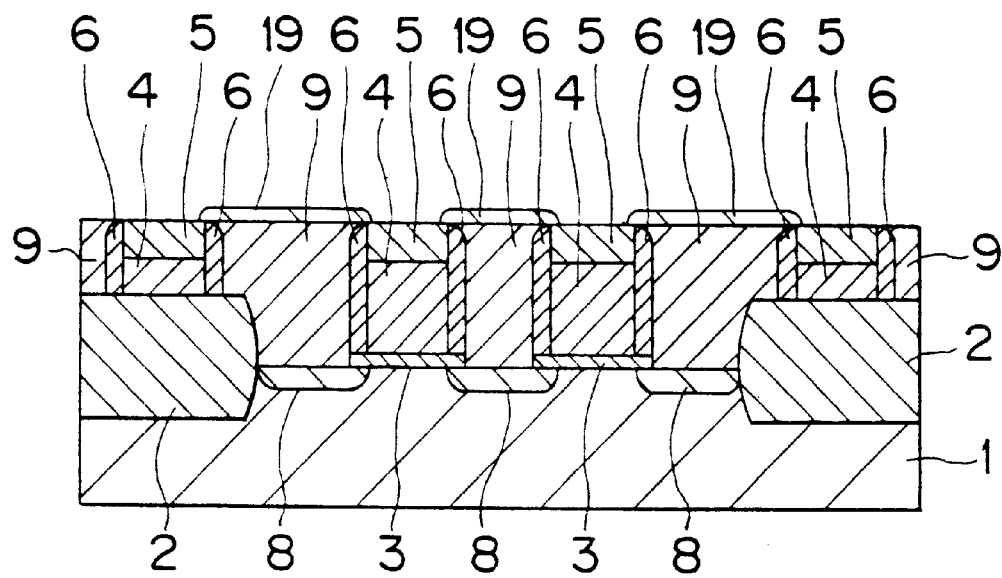

As shown in FIG. 8K, photolithography and dry etching are performed to remove the titanium film 18 other than from the silicide films on the lead-out electrodes 9, and the lead-out electrodes 9 are patterned into a predetermined shape on the impurity diffusion layers 8, as in the fourth embodiment.

Figure 8L:
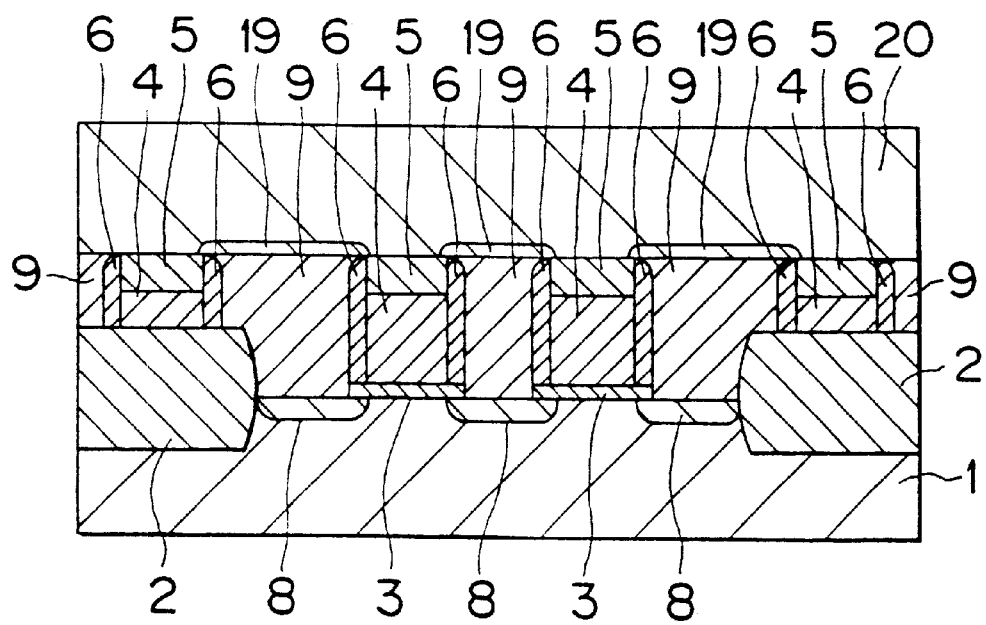
Figure 8M:
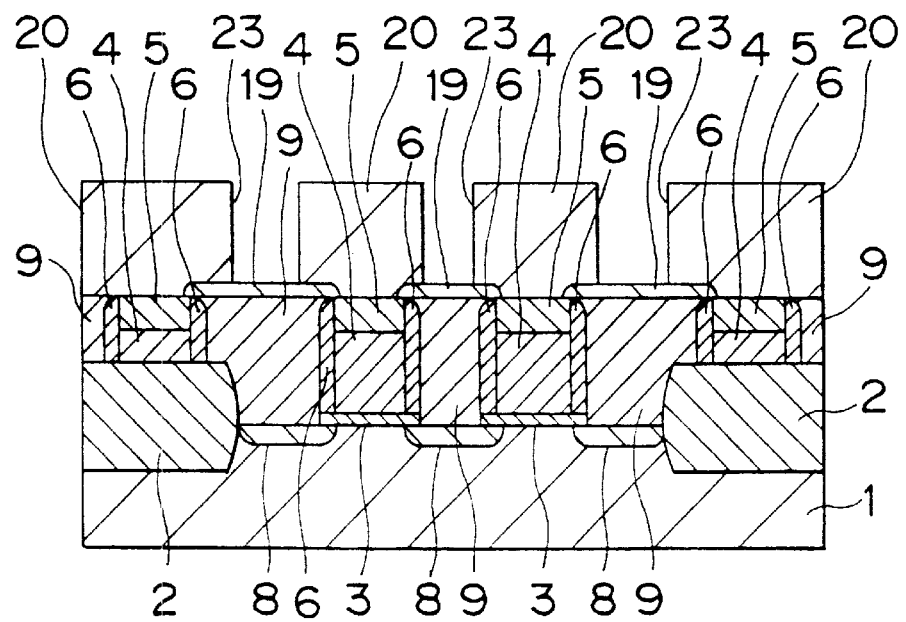

As shown in FIG. 8L, a BPSG film 20 is formed on the entire surface of the silicon semiconductor substrate 1 by CVD and reflowed to planarize the surface. As shown in FIG. 8M, opening portions 23 are formed in the BPSG film 20 to expose the titanium silicide film 19 on the lead-out electrodes 9.

Figure 8N:
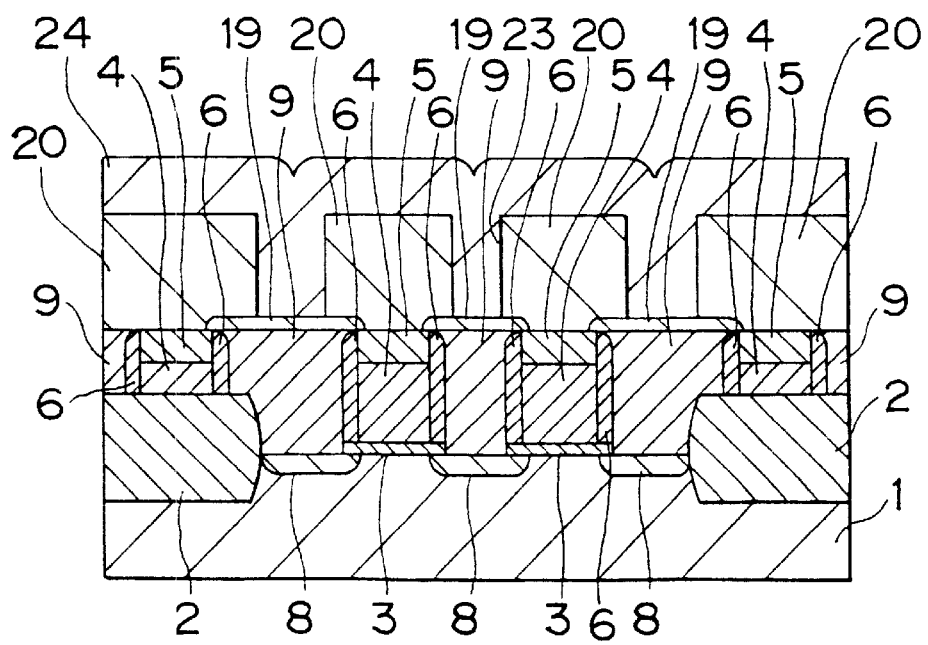
Figure 80:
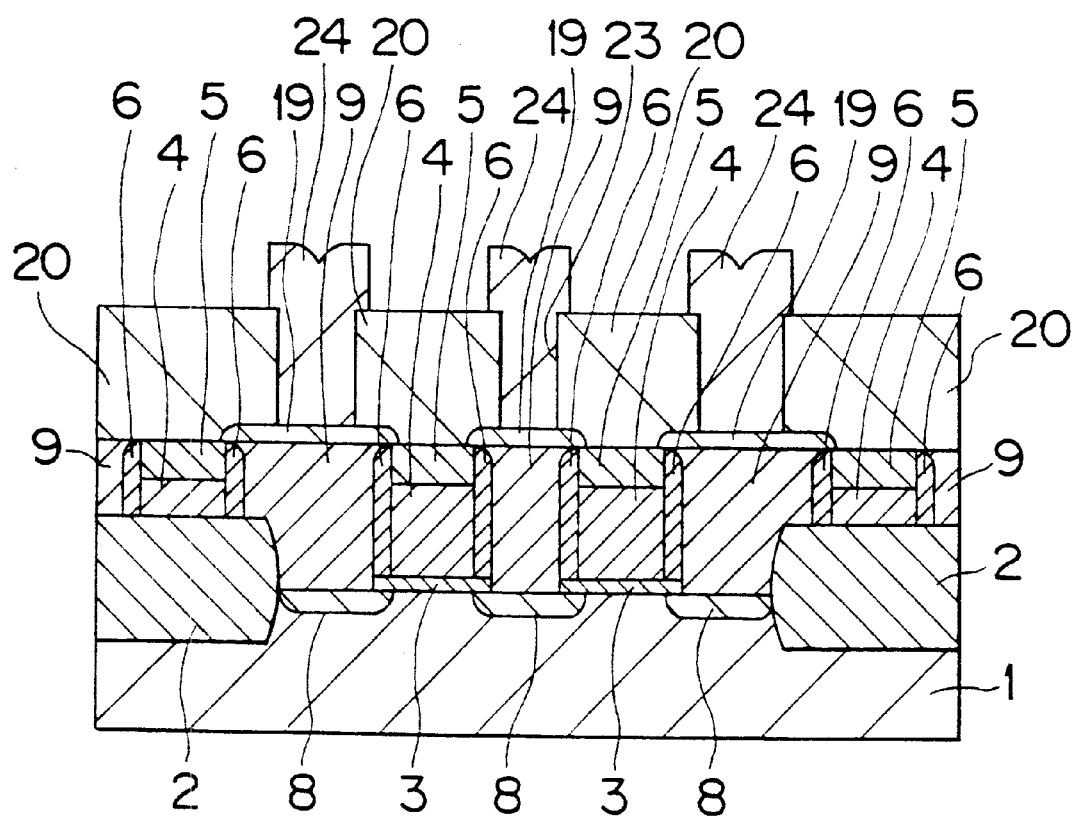

As shown in FIG. 8N, an aluminum wiring layer 24 is formed on the entire surface by sputtering and patterned into a predetermined shape. Postprocessing is performed, thus completing the MOS transistor as shown in FIG. 8O.

As described above, in the fifth embodiment, after the polysilicon film 7 is formed, the polysilicon film 7 is polished by chemical mechanical polishing (CMP) using the cap insulating films 5 as a stopper, thereby planarizing the surface.

Impurities are ion-implanted at a low concentration by the first ion implantation such that the concentration peak is formed near the lower surface of the polysilicon film 7, and the impurities are present in about the lower ⅓ range of the thickness of the polysilicon film 7. Next, impurities are ion-implanted at an intermediate concentration by the second ion implantation such that the concentration peak is formed almost at the center in the direction of thickness of the polysilicon film 7, and the impurities are present in about the ⅓ range of the thickness of the polysilicon film 7. Thereafter, impurities are ion-implanted at a high concentration by the third ion implantation such that the concentration peak is formed near the upper surface of the polysilicon film 7, and the impurities are present in about the upper ⅓ range of the thickness of the polysilicon film 7.

Annealing is performed to diffuse the low-concentration impurities of the first ion implantation into the silicon semiconductor substrate 1. With this process, the pair of impurity diffusion layers 8 serving as source and drain regions each having a lightly doped shallow junction can be formed. Simultaneously, the high- and intermediate-concentration impurities of the second and third ion implantations are diffused in the polysilicon film 7 by the above-described annealing. With this process, the lead-out electrode 9 can be formed by diffusing the high-concentration impurities.

At this time, since the surface of the polysilicon film 7 is planarized, the impurities can be almost uniformly diffused in the lead-out electrode 9 by annealing. Even in case wherein the lead-out electrode 9 is thick, since the second ion implantation is performed aiming at the center of the polysilicon film 7 in the direction of thickness, the impurity concentration near the center of the lead-out electrode 9 in the direction of thickness can be prevented from becoming, so that the resistance can be lowered.

Therefore, the impurity diffusion layers 8 each having a shallow junction are formed to suppress generation of hot carriers and the short channel effect. In addition, the resistance of the lead-out electrode 9 can be almost uniformly lowered.

In the semiconductor device of the present invention, a substrate having a so-called SOI structure in which a silicon substrate is arranged on an oxide substrate may be used in place of the silicon semiconductor substrate 1 used in the first to fifth embodiments. The SOI substrate may be either a laminated substrate or a so-called SIMOX substrate.

What is claimed is:

1. A semiconductor device comprising:
    a thin film having an impurity concentration peak formed near at least one of an upper end face and lower end face of said thin film; and
    a conductive film connected to the end face close to a region where the impurity concentration peak is formed;
    a second film formed on a side of said thin film opposite said conductive film, said impurity concentration peak not affecting an impurity concentration of said second film.

2. A device according to claim 1, wherein said thin film is made of a silicon film.

3. A device according to claim 1, wherein said thin film is made of a silicon film, and said conductive film is a silicide film.

4. A device according to claim 1, wherein said thin film is made of a silicon film, and said conductive film is an impurity diffusion layer formed in a semiconductor substrate.

5. A semiconductor device according to claim 1 wherein said thin film contains primarily a single type of impurity.

6. A semiconductor device according to claim 1 wherein said impurity concentration peak is formed in a lower ⅓ range of thickness of said thin film.

7. A semiconductor device according to claim 1 wherein said impurity concentration peak is formed in an upper ⅓ range of thickness of said thin film.

8. A semiconductor device comprising:
    an impurity diffusion layer formed in a substrate;
    a wiring film formed on said impurity diffusion layer containing substantially a single type of impurity and having an impurity concentration distributed such that a top portion of said wiring film has a high impurity concentration to make said film electrically conductive and a bottom portion of said wiring film, contacting said impurity diffusion layer, has a relatively lower impurity concentration to reduce a junction depth of said impurity diffusion layer.

9. A semiconductor device comprising:
    an impurity diffusion layer formed in a substrate;
    a wiring film formed on said impurity diffusion layer containing substantially a single type of impurity and having an impurity concentration distributed such that a top portion of said wiring film has a high impurity concentration to make said film electrically conductive and a bottom portion of said wiring film, contacting said impurity diffusion layer, has a relatively lower impurity concentration to reduce a junction depth of said impurity diffusion,
    wherein a doping profile in said wiring film is arranged such that said high impurity concentration in said top portion does not contribute to a peak concentration of said relatively lower impurity concentration in said bottom portion.

10. A semiconductor device comprising:
    an impurity diffusion layer formed in a substrate;
    a wiring film formed on said impurity diffusion layer containing substantially a single type of impurity and having an impurity concentration distributed such that a top portion of said wiring film has a high impurity concentration to make said film electrically conductive and a bottom portion of said wiring film, contacting said impurity diffusion layer, has a relatively lower impurity concentration to reduce a junction depth of said impurity diffusion,
    wherein a doping profile in said wiring film is arranged such that said high impurity concentration in said top portion does not contribute to an impurity concentration in said impurity diffusion layer.

11. A semiconductor device comprising:
    an impurity diffusion layer formed in a substrate;
    a wiring film formed on said impurity diffusion layer containing substantially a single type of impurity and having an impurity concentration distributed such that a top portion of said wiring film has a high impurity concentration to make said film electrically conductive and a bottom portion of said wiring film, contacting said impurity diffusion layer, has a relatively lower impurity concentration to reduce a junction depth of said impurity diffusion,
    wherein said top portion is an upper ⅓ range of thickness of said thin film.

12. A semiconductor device comprising:
    an impurity diffusion layer formed in a substrate;
    a wiring film formed on said impurity diffusion layer containing substantially a single type of impurity and having an impurity concentration distributed such that a top portion of said wiring film has a high impurity concentration to make said film electrically conductive and a bottom portion of said wiring film, contacting said impurity diffusion layer, has a relatively lower impurity concentration to reduce a junction depth of said impurity diffusion, wherein said bottom portion is a lower ⅓ range of thickness of said thin film.

13. A semiconductor device comprising:

a thin film containing substantially a single type of impurity and having an impurity concentration peak formed near at least one of its upper end face and lower end face;

a conductive film connected to an end face close to a region where said impurity concentration peak is formed; and a second film connected to a side of said thin film opposite said conductive film.

14. The semiconductor device of claim 13, wherein said impurity concentration peak is formed in an upper ⅓ range of thickness of said thin film and does not contribute to an impurity concentration in said second film.

15. The semiconductor device of claim 13 wherein said impurity concentration peak is formed in an upper ⅓ range of thickness of said thin film and does not contribute to an impurity concentration of said conductive film.

* * * * *